(12) United States Patent
Kobayashi et al.

(10) Patent No.: US 10,770,582 B2
(45) Date of Patent: Sep. 8, 2020

(54) SEMICONDUCTOR DEVICE

(71) Applicant: FUJI ELECTRIC CO., LTD., Kawasaki (JP)

(72) Inventors: Yusuke Kobayashi, Nagareyama (JP); Manabu Takei, Shiojiri (JP); Naoki Kumagai, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 16/518,375

(22) Filed: Jul. 22, 2019

(65) Prior Publication Data

US 2020/0083369 A1    Mar. 12, 2020

(30) Foreign Application Priority Data

Sep. 11, 2018  (JP) ................................. 2018-170108

(51) Int. Cl.
| | |
|---|---|
| *H01L 29/78* | (2006.01) |
| *H01L 29/417* | (2006.01) |
| *H01L 29/47* | (2006.01) |
| *H01L 29/16* | (2006.01) |
| *H01L 29/66* | (2006.01) |
| *H01L 29/423* | (2006.01) |

(52) U.S. Cl.
CPC ...... *H01L 29/7813* (2013.01); *H01L 29/1608* (2013.01); *H01L 29/41766* (2013.01); *H01L 29/47* (2013.01); *H01L 29/66068* (2013.01); *H01L 29/7806* (2013.01); *H01L 29/4236* (2013.01); *H01L 29/42356* (2013.01); *H01L 29/781* (2013.01); *H01L 29/7812* (2013.01)

(58) Field of Classification Search
None
See application file for complete search history.

(56) References Cited

U.S. PATENT DOCUMENTS

| | | | |
|---|---|---|---|
| 5,614,749 A | | 3/1997 | Ueno |
| 9,543,428 B2* | | 1/2017 | Takeuchi ............ H01L 29/1095 |
| 2015/0115286 A1 | | 4/2015 | Takeuchi et al. |
| 2016/0247910 A1 | | 8/2016 | Suzuki et al. |
| 2018/0301536 A1* | | 10/2018 | Utsumi ............... H01L 29/1095 |
| 2019/0109228 A1* | | 4/2019 | Kobayashi .......... H01L 29/1095 |
| 2019/0165161 A1* | | 5/2019 | Arai .................... H01L 29/7802 |

FOREIGN PATENT DOCUMENTS

| | | |
|---|---|---|
| JP | 8-204179 A | 8/1996 |
| JP | 2014-17469 A | 1/2014 |
| JP | 2015-72999 A | 4/2015 |

\* cited by examiner

*Primary Examiner* — Minh Loan Tran

(57) ABSTRACT

A vertical MOSFET having a trench gate structure includes an n⁻-type drift layer and a p-type base layer formed by epitaxial growth. In the n⁻-type drift layer, an n-type region, a first p⁺-type region, and a second p⁺-type region are provided. A metal film of a trench SBD is connected to a source electrode; and a p⁺-type region is provided between the source electrode and the p-type base layer.

7 Claims, 29 Drawing Sheets

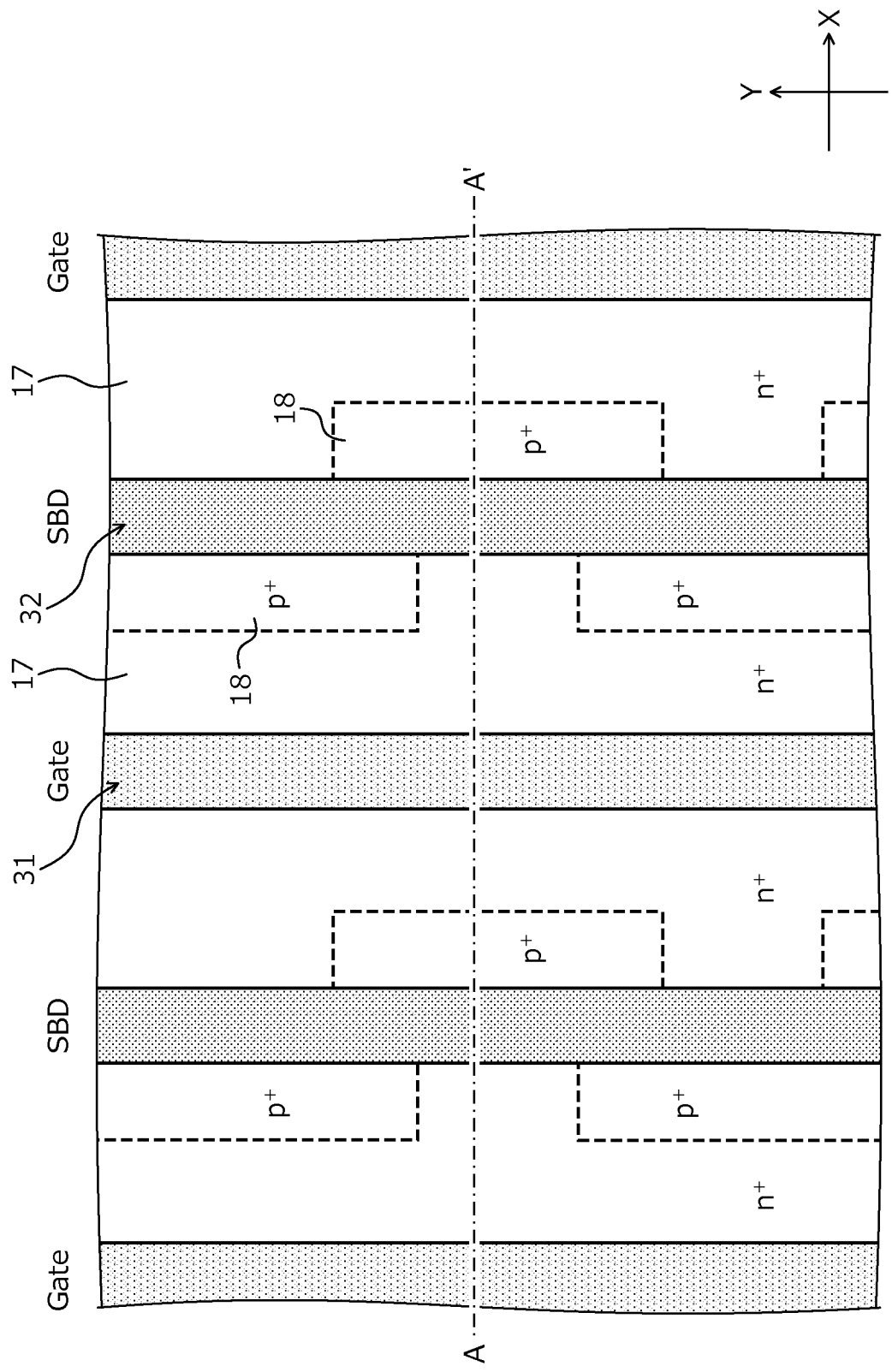

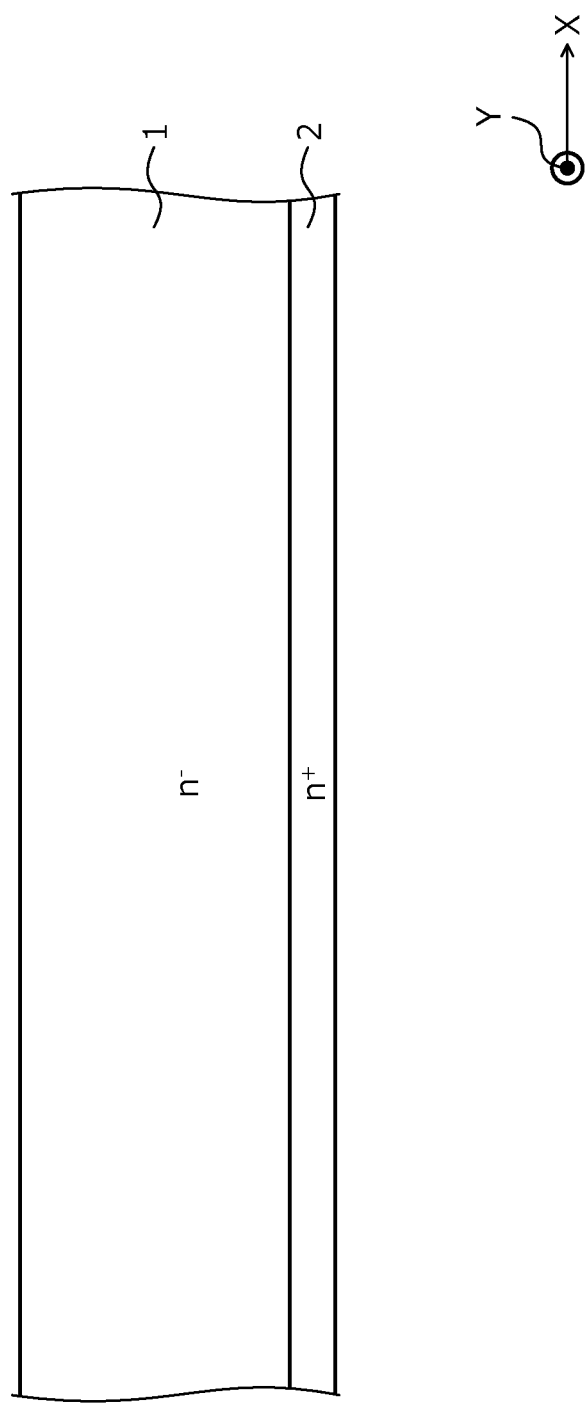

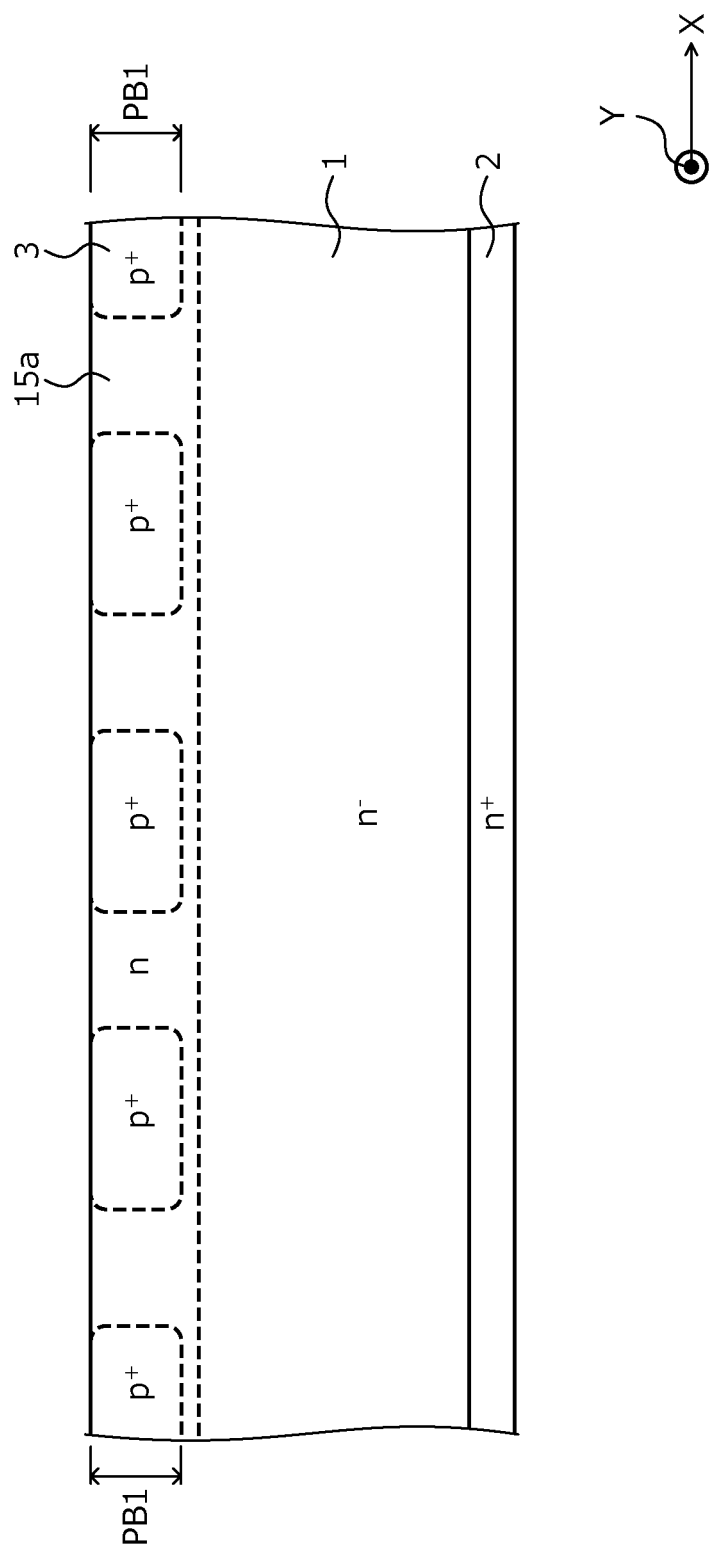

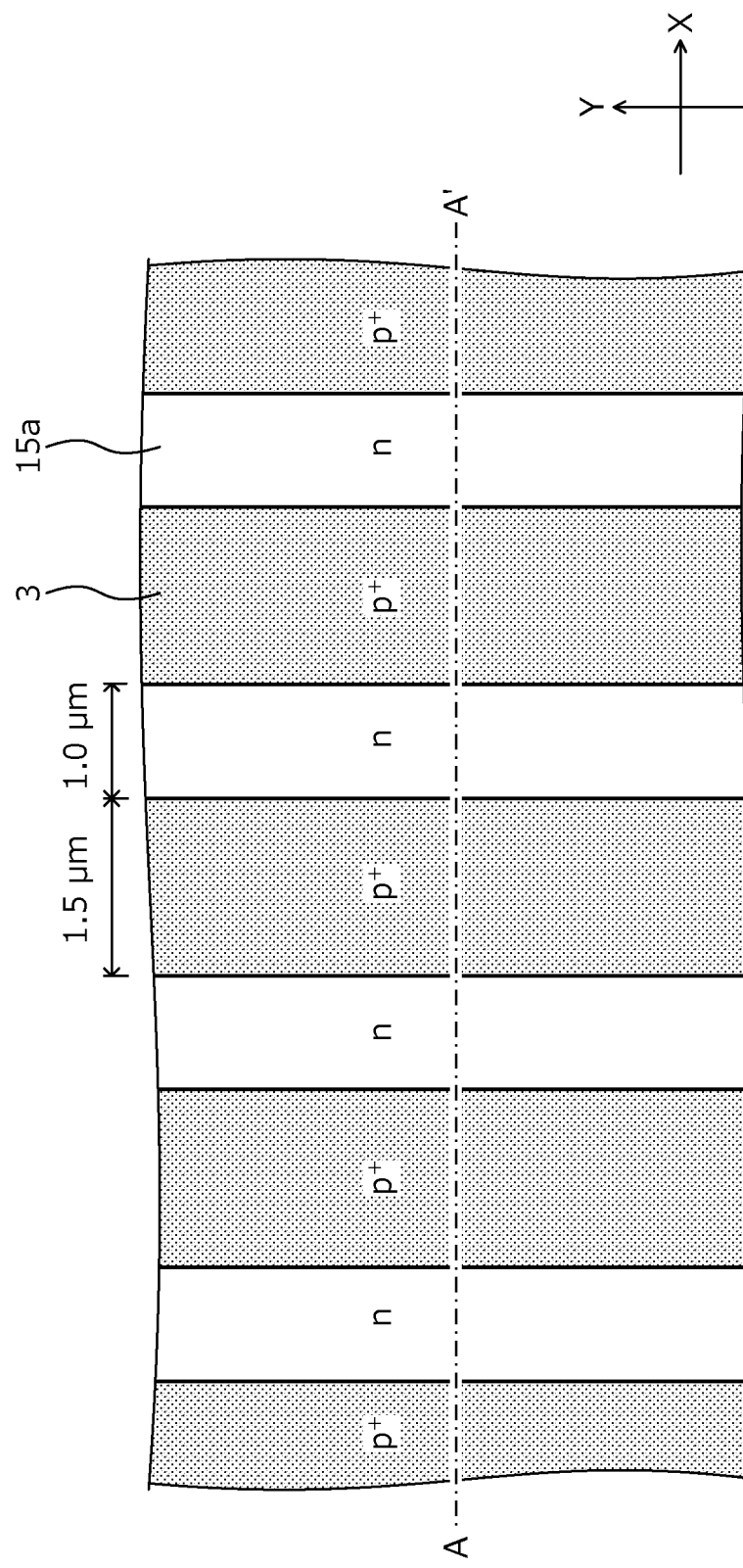

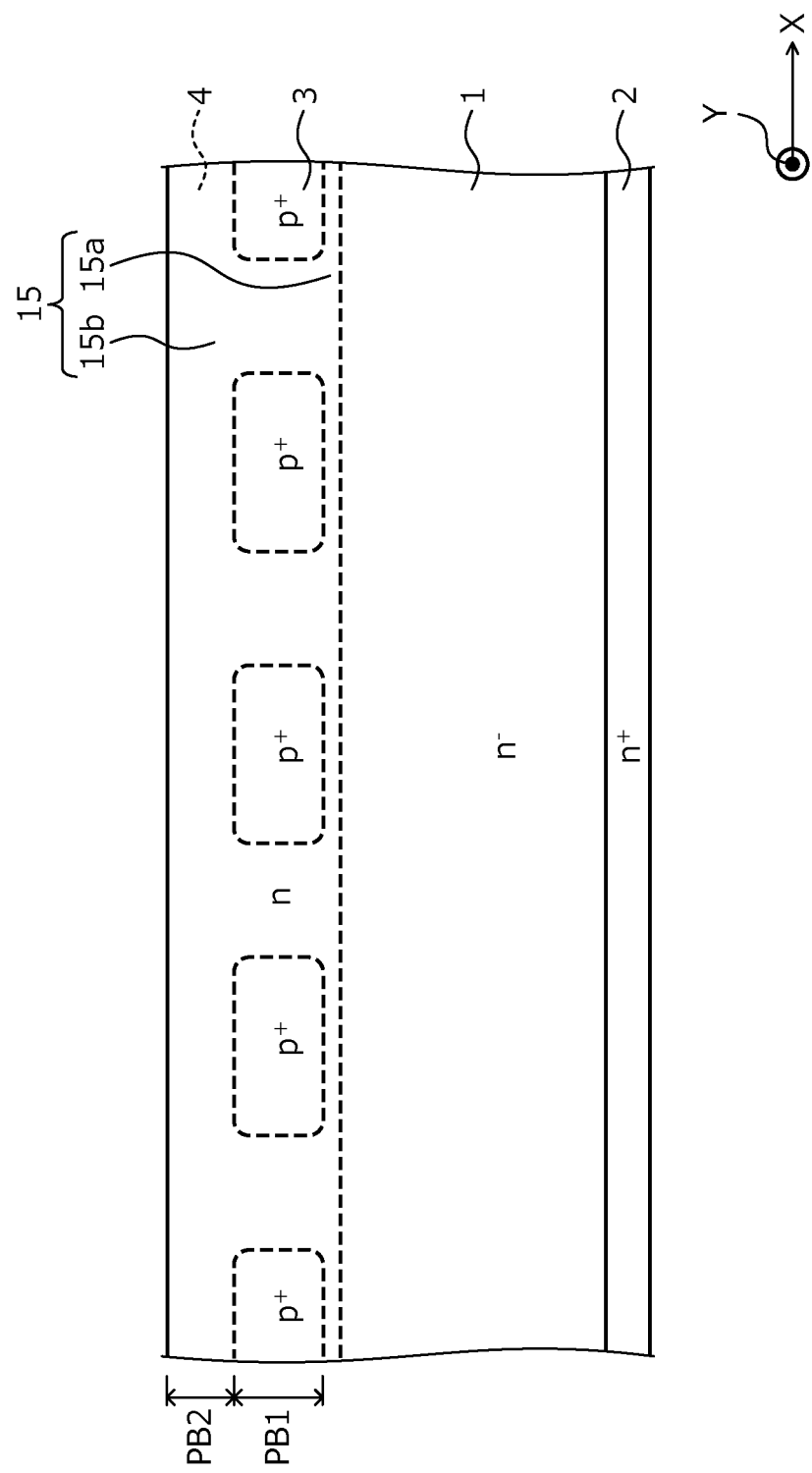

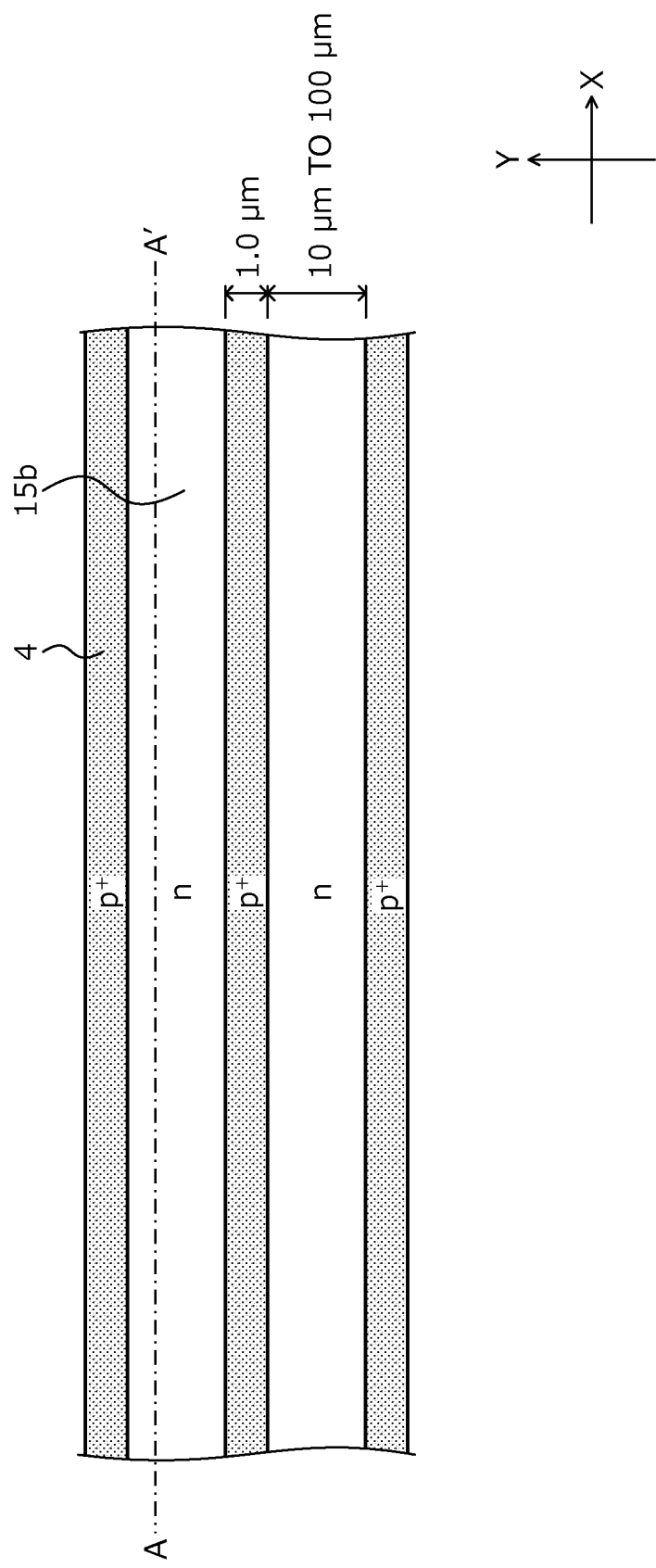

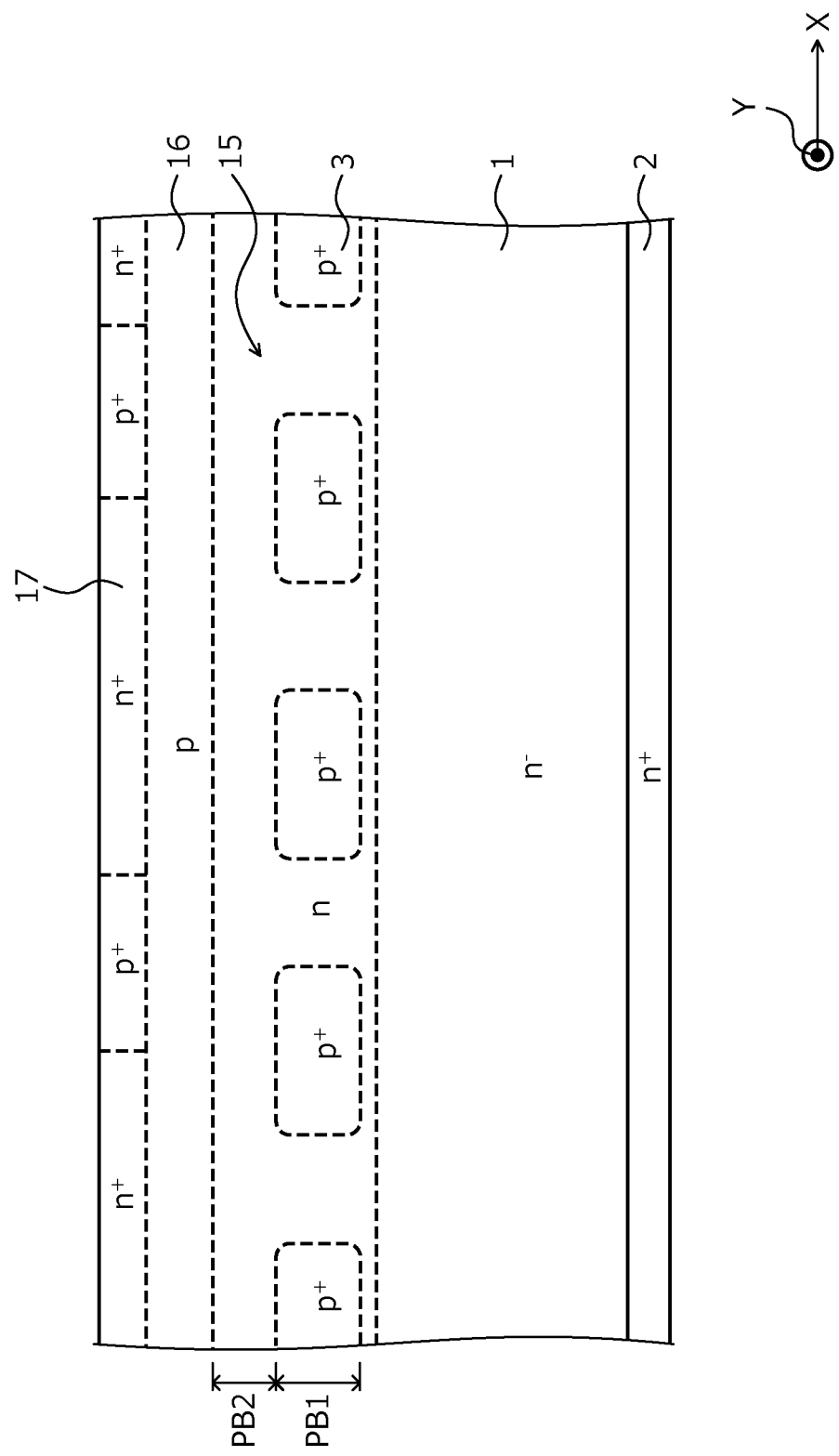

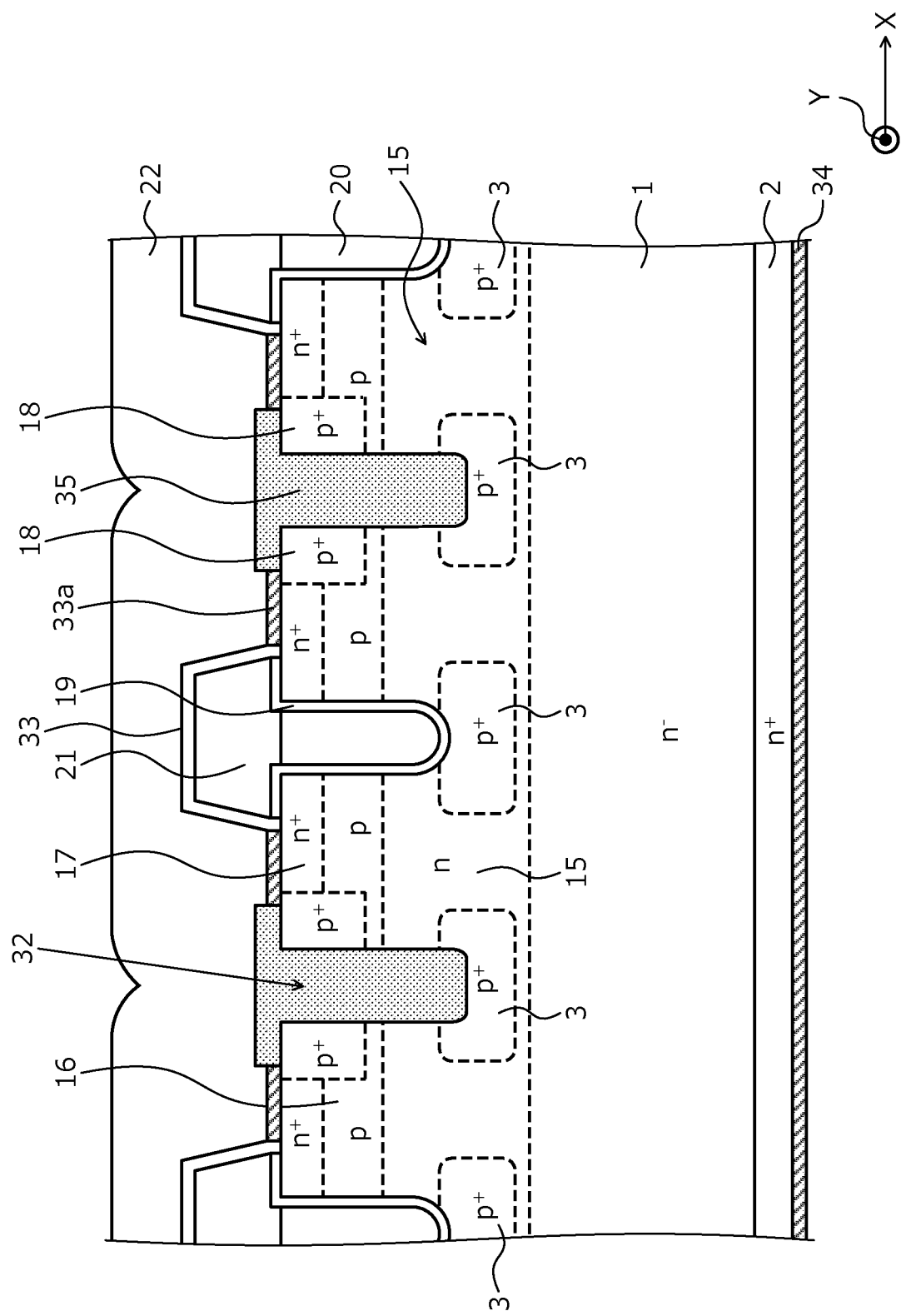

SEMICONDUCTOR DEVICE

CROSS REFERENCE TO RELATED APPLICATIONS

This application is based upon and claims the benefit of priority of the prior Japanese Patent Application No. 2018-170108, filed on Sep. 11, 2018, the entire contents of which are incorporated herein by reference.

BACKGROUND

1. Field

The embodiments discussed herein relate to a semiconductor device.

2. Description of Related Art

In a power semiconductor device, a vertical metal oxide semiconductor field effect transistor (MOSFET) having a trench structure is fabricated (manufactured) to reduce device ON resistance. As compared to a planar structure in which a channel is formed parallel to a substrate surface, in a vertical MOSFET, the trench structure in which the channel is formed vertically with respect to the substrate surface enables increased cell density per unit area and thereby enables increased current density per unit area, which is advantageous in terms of cost.

Nonetheless, when a trench structure is formed in a vertical MOSFET, the inner wall of the trench is entirely covered by a gate insulating film to form a channel in a vertical direction and since a portion of the gate insulating film at the bottom of the trench is near a drain electrode, high electric field is likely to be applied to the portion of the gate insulating film at the bottom of the trench. In particular, ultra-high voltage devices are fabricated using a wide bandgap semiconductor material (semiconductor material having a bandgap wider than that of silicon, e.g., silicon carbide (SiC)), whereby the gate insulating film at the bottom of the trench is adversely affected and thus, reliability decreases significantly.

As a method of solving such problems, a technique has been proposed in which, in a vertical MOSFET having a trench structure that has a striped planar pattern, a $p^+$-type region is provided between trenches, in a striped shape parallel to the trenches and a $p^+$-type region is further provided at the bottom of the trenches, in a striped shape parallel to the trench (for example, refer to Japanese Laid-Open Patent Publication No. 2015-72999).

FIG. 24 is a cross-sectional view of a structure of a conventional silicon carbide semiconductor device. The conventional silicon carbide semiconductor device depicted in FIG. 24 includes a MOS gate having a general trench gate structure on a front surface (surface on a p-type base layer 1016 side) of a semiconductor base (hereinafter, silicon carbide base) that contains silicon carbide. The silicon carbide base (semiconductor chip) is formed by sequentially forming on an $n^+$-type starting substrate (hereinafter, $n^+$-type silicon carbide substrate) 102 that contains silicon carbide, silicon carbide layers that constitute an $n^-$-type drift layer 101, an n-type region 1015 that is a current spreading region, and a p-type base layer 1016.

A first $p^+$-type region 103 is selectively formed in the n-type region 1015 so as to entirely cover a bottom of a trench gate 1031. The first $p^+$-type region 103 is provided at depth not reaching the $n^-$-type drift layer 101. The first $p^+$-type region 103 is further selectively provided between (mesa portion) the trench gate 1031 and an adjacent trench 1031, in the n-type region 1015. The first $p^+$-type region 103 that is between the trench gate 1031 and the adjacent trench 1031 is provided so as to be in contact with the p-type base layer 1016. Reference numerals 1017, 1018, 1019, 1020, 1021, and 1022 are an $n^+$-type source region, a $p^+$-type region, a gate insulating film, a gate electrode, an interlayer insulating film, and a source electrode, respectively. Reference numeral 1033 is a metal film, and reference numeral 1033a is an ohmic electrode.

A vertical MOSFET has as a body diode between a source and a drain, a built-in parasitic pn diode formed by a p-type base layer and an n-type drift layer. Therefore, a free wheeling diode (FWD) used in an inverter may be omitted to contribute to reductions in cost and size. Nonetheless, when a silicon carbide substrate is used as a semiconductor substrate, compared to a case in which a silicon (Si) substrate is used, the parasitic pn diode has high built-in potential and therefore, ON resistance of the parasitic pn diode increases, inviting increases in loss. Further, when the parasitic pn diode is ON and energized, characteristics vary temporally (degrade over time) due to bipolar operation of the parasitic pn diode, causing forward degradation and/or increases in turn OFF loss.

To address this problem, on a circuit, a Schottky barrier diode (SBD) may be connected in parallel to the MOSFET so that during flyback, current flows in the SBD and does not flow in the parasitic pn diode. Nonetheless, cost increases because the number of SBD chips required is about equal to the number of MOSFET chips.

Therefore, since the SBD has to connect the n-type drift layer and the source electrode, a technique has been proposed in which a contact trench is formed at the substrate surface to penetrate a p-type channel portion and thereby incorporate the SBD into the trench inner wall, whereby current during flyback flows in the built-in SBD and not the PiN diode (for example, refer to Japanese Laid-Open Patent Publication No. H8-204179).

FIG. 25 is a cross-sectional view of a structure of the silicon carbide semiconductor device having a conventional built-in SBD. As depicted in FIG. 25, a trench gate MOS gate structure and a trench SBD 1032 are provided at the front surface of the $n^+$-type silicon carbide substrate 102. In particular, on the $n^+$-type silicon carbide substrate 102, an $n^-$-type layer constituting the $n^-$-type drift layer 101 is formed by epitaxial growth, and on the front surface (surface on an $n^-$-type drift layer 101 side) side of the $n^+$-type silicon carbide substrate 102, a MOS gate structure is provided that is constituted by the p-type base layer 1016, the $n^+$-type source region 1017, the trench gate 1031, the gate insulating film 1019, and the gate electrode 1020.

Further, the trench SBD 1032 is a trench in which an inner wall of the trench is covered by a Schottky metal that connects the trench to the source electrode 1022, forming a Schottky junction between the n-type region 1015 exposed at the inner wall and the Schottky metal. In this manner, in FIG. 25, a parasitic Schottky diode (built-in SBD) is provided in parallel to the parasitic pn diode between the source and the drain.

When positive voltage is applied to the source electrode 1022 and negative voltage is applied to the drain electrode (not depicted) provided at the rear surface of the $n^+$-type silicon carbide substrate 102 (OFF state of the MOSFET), a pn junction between the p-type base layer 1016 and the $n^-$-type drift layer 101 is forward biased. In FIG. 25, by designing the silicon carbide semiconductor device so that the parasitic Schottky diode turns ON before the parasitic pn diode turns ON when the MOSFET is OFF, bipolar operation of the parasitic pn diode is suppressed, enabling prevention of degradation that occurs over time due to the bipolar operation.

Further, a technique has been proposed where in a silicon carbide semiconductor device that has a contact trench in which a Schottky electrode having a Schottky contact is formed, a p-type layer is provided at a bottom of the contact trench to enhance breakdown voltage (for example, refer to Japanese Laid-Open Patent Publication No. 2014-017469).

SUMMARY

According to an embodiment of the present invention, a semiconductor device includes a semiconductor substrate of a first conductivity type; a first semiconductor layer that is of the first conductivity type, provided on a front surface of the semiconductor substrate, and has an impurity concentration lower than an impurity concentration of the semiconductor substrate; a first semiconductor region that is of a second conductivity type and selectively provided in the first semiconductor layer; a second semiconductor region that is of the second conductivity type and selectively provided at a first surface of the first semiconductor layer, the first surface being opposite a second surface of the first semiconductor layer, the second surface facing toward the semiconductor substrate; a second semiconductor layer that is of the second conductivity type and provided on the first surface of the first semiconductor layer; third semiconductor regions that are of the first conductivity type, selectively provided in the second semiconductor layer of the second conductivity type, and have an impurity concentration higher than the impurity concentration of the semiconductor substrate; a first trench and a second trench that penetrate the third semiconductor regions of the first conductivity type and the second semiconductor layer of the second conductivity type, reach the first semiconductor layer, and have respective bottoms that are in contact with the first semiconductor regions, respectively; a gate electrode that is provided in the first trench, via a gate insulating film; a Schottky electrode that is provided in the second trench and that is connected to a source electrode; and a third semiconductor region that is of the second conductivity type, provided in a side portion of the second trench, and has an impurity concentration higher than the impurity concentration of the second semiconductor layer that is of the second conductivity type.

In the embodiment, the third semiconductor region of the second conductivity type is provided between the source electrode and the second semiconductor layer of the second conductivity type.

In the embodiment, the third semiconductor region of the second conductivity type is provided in a first side portion and a second side portion sandwiching the second trench, the third semiconductor region being provided to be continuous, or to alternate, or be intermittent along a formation direction of the second trench.

In the embodiment, the third semiconductor region of the second conductivity type is in contact with one of the third semiconductor regions of the first conductivity type.

In the embodiment, the third semiconductor region of the second conductivity type is provided in the second semiconductor layer of the second conductivity type.

In the embodiment, the third semiconductor region of the second conductivity type is provided in the second semiconductor layer of the second conductivity type and one of the third semiconductor regions of the first conductivity type.

In the embodiment, the third semiconductor region of the second conductivity type is provided at a position in a first side portion and a position in a second side portion sandwiching the second trench, the third semiconductor region being provided to be continuous, or to alternate, or to be intermittent long a formation direction of the second trench, and to connect the first semiconductor region and the second semiconductor layer of the second conductivity type.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 1B is a top view of the structure of the silicon carbide semiconductor device according to the embodiment.

FIG. 2 is a cross-sectional view of the silicon carbide semiconductor device according to the embodiment during manufacture.

FIG. 3A is a cross-sectional view of the silicon carbide semiconductor device according to the embodiment during manufacture.

FIG. 3B is a top view of the silicon carbide semiconductor device according to the embodiment during manufacture.

FIG. 4A is a cross-sectional view of the silicon carbide semiconductor device according to the embodiment during manufacture.

FIG. 4B is a top view of the silicon carbide semiconductor device according to the embodiment during manufacture.

FIG. 5 is a cross-sectional view of the silicon carbide semiconductor device according to the embodiment during manufacture.

FIG. 18Ab is a cross-sectional view of the structure of the silicon carbide semiconductor device depicted in 18Aa.

FIG. 18B is a cross-sectional view of another structure of the silicon carbide semiconductor device depicted in FIG. 18Aa.

DESCRIPTION OF EMBODIMENTS

Figure 24:
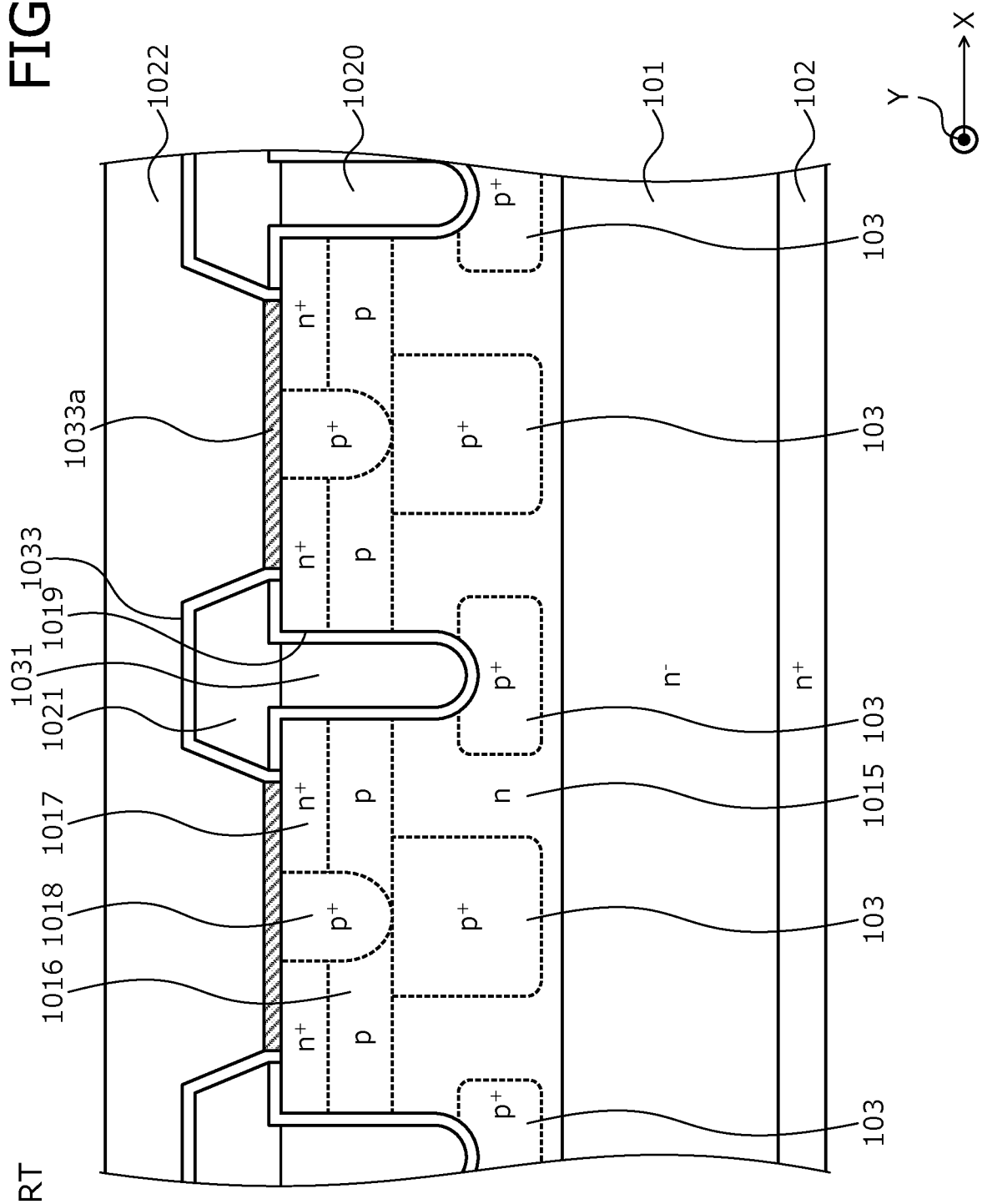
FIG. 24 is a cross-sectional view of a structure of a conventional silicon carbide semiconductor device.
Figure 25:
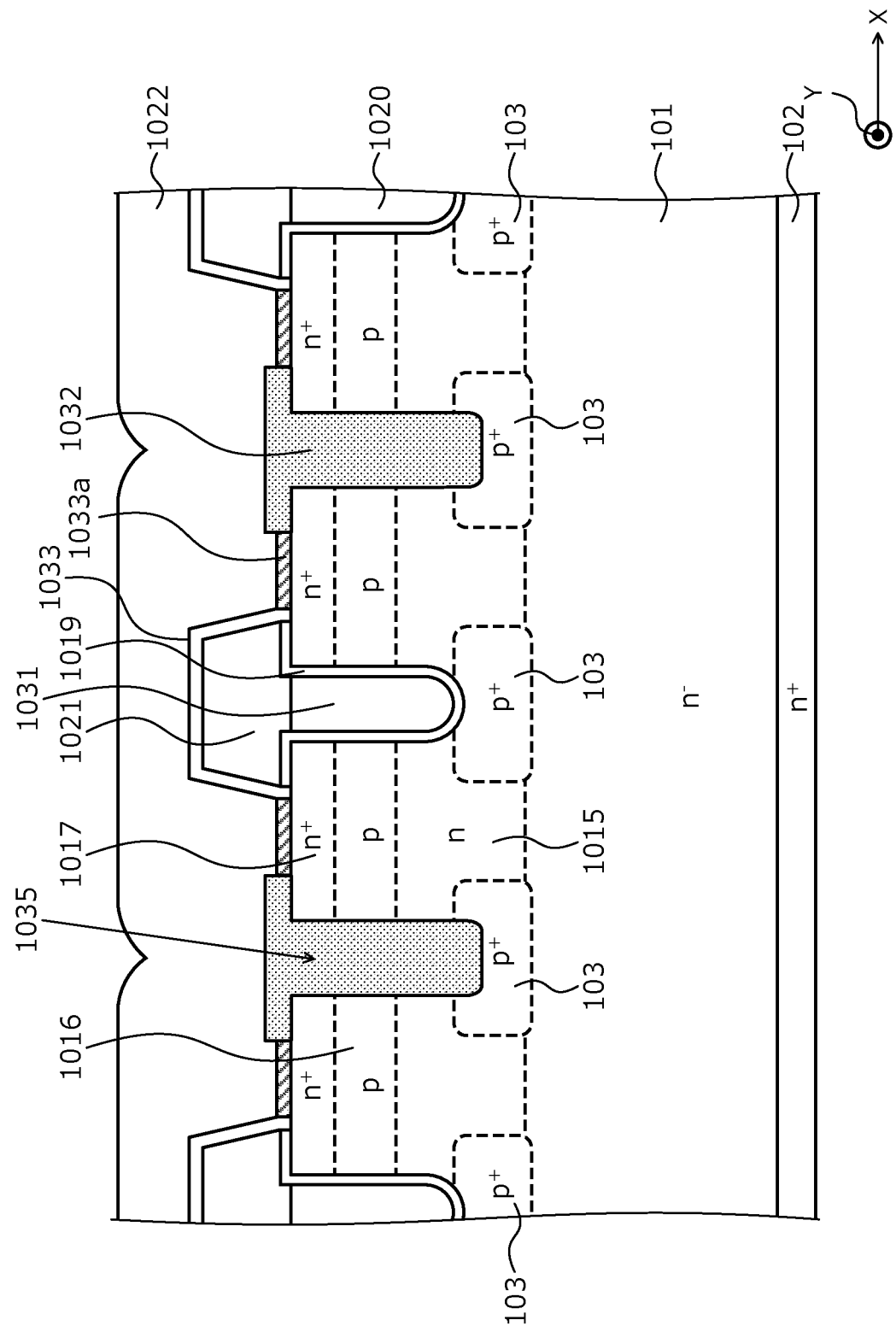
FIG. 25 is a cross-sectional view of a structure of the silicon carbide semiconductor device having a conventional built-in SBD.

First, problems associated with the conventional techniques will be discussed. The silicon carbide semiconductor device having the trench MOSFET with the described conventional built-in SBD enables cell pitch to be reduced by disposing the SBD so as to penetrate the n$^+$-type source region 1017. Nonetheless, as compared to contact between an ohmic metal and the p$^+$-type region 1018 that has a high impurity concentration in the conventional trench MOSFET depicted in FIG. 24, contact resistance between the p-type base layer 1016 and the source electrode 1022 is high because contact is between the Schottky metal and the p-type base layer 1016 that has a low impurity concentration. As a result, electric potential of the p-type base layer 1016 and/or the first p$^+$-type region 103 is unstable, inviting decreases in avalanche resistance and the threshold value during switching, etc.

Embodiments of a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described. Further, temperatures indicated are in Centigrade.

The semiconductor device according to an embodiment is configured using a semiconductor material (hereinafter, wide bandgap semiconductor material) that has a bandgap wider than that of silicon. Here, a structure of a semiconductor device (silicon carbide semiconductor device) in which, for example, silicon carbide (SiC) is used as the wide bandgap semiconductor material will be described as an example.

Figure 1A:
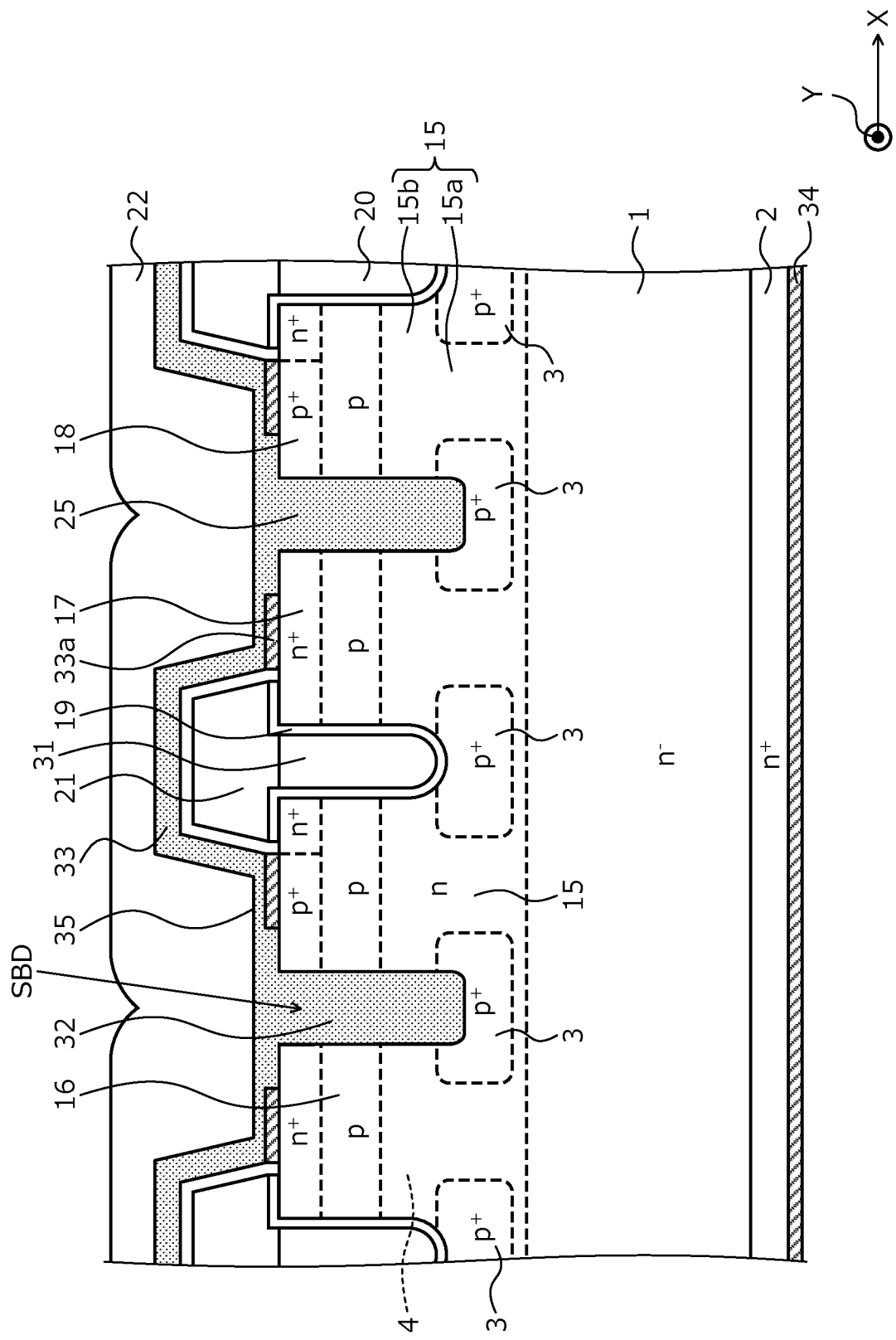
FIG. 1A is a cross-sectional view of a structure of a silicon carbide semiconductor device according to an embodiment.

FIG. 1A is a cross-sectional view of a structure of the silicon carbide semiconductor device according to the embodiment. FIG. 1B is a top view of a structure of the silicon carbide semiconductor device according to the embodiment. FIG. 1A is a cross-sectional view along cutting line A-A' in FIG. 1B. In the drawings hereinafter, only two unit cells (functional units of an element) in an active region are depicted and other unit cells that are adjacent to these are not depicted. The silicon carbide semiconductor device according to the embodiment is a MOSFET that includes a MOS gate on a front surface (surface on a p-type base layer 16 side) side of a semiconductor base (silicon carbide base: semiconductor chip) that contains silicon carbide.

The silicon carbide base is formed by sequentially forming on an n$^+$-type silicon carbide substrate (semiconductor substrate of a first conductivity type) 2 containing silicon carbide, silicon carbide layers that constitute an n$^-$-type drift layer (first semiconductor layer of the first conductivity type) 1 and a p-type base layer (second semiconductor layer of a second conductivity type) 16, respectively. In the active region, the MOS gate is constituted by a p-type base layer 16, an n$^+$-type source region (third semiconductor region of the first conductivity type) 17, a p$^+$-type region 18, a trench gate 31, a gate insulating film 19, and a gate electrode 20. In particular, in a surface layer on a source side (a source electrode 22 side) of the n$^-$-type drift layer 1, an n-type region 15 is provided so as to be in contact with a first p$^+$-type region 3. The n-type region 15 is a so-called current spreading layer (CSL) that reduces carrier spreading resistance. The n-type region (fourth semiconductor region of the first conductivity type) 15, for example, is provided to be uniform along a direction parallel to a base front surface (front surface of the silicon carbide base). Further, on a rear surface of the n$^+$-type silicon carbide substrate 2, a metal film 34 such as a nickel (Ni) film, a titanium (Ti) film, etc. is provided as an ohmic electrode at a contact portion of a drain electrode using sputter deposition, etc.

In the n-type region 15, a first p$^+$-type region (first semiconductor region of the second conductivity type) 3 and a second p$^+$-type region (second semiconductor region of the second conductivity type) 4 are each selectively provided. In the active region, the first p$^+$-type regions 3 are provided so as to be in contact with a bottom of the trench gate described hereinafter (first trench) 31 and a bottom of a trench SBD (second trench) 32, respectively. The first p$^+$-type regions 3 are provided from a position closer to the rear surface of the n$^+$-type silicon carbide substrate 2 than is an interface between the p-type base layer 16 and the n-type region 15, to a depth not reaching an interface between the n-type region 15 and the n$^-$-type drift layer 1. Provision of the first p$^+$-type regions 3 enables pn junctions to be formed between the first p$^+$-type regions 3 and the n-type region 15 near the bottom of the trench gate 31 and the bottom of the trench SBD 32. The first p$^+$-type regions 3 have an impurity concentration that is higher than an impurity concentration of the p-type base layer 16.

Further, the first p$^+$-type regions 3 are separated from each other along a width direction of the trench gate 31 and the trench SBD 32, and between the first p$^+$-type regions 3, the n-type region 15 is provided that has an impurity concentration higher than an impurity concentration of the n⁻-type drift layer 1.

Further, the second p⁺-type region 4 is a region connected to the p-type base layer 16 and positioned at an upper side of the first p⁺-type region 3. As a result, holes that occur when avalanche breakdown occurs at junctions between the first p⁺-type regions 3 and the n-type region 15 are efficiently migrated to a source electrode 22, thereby enabling load on the gate insulating film 19 to be reduced and reliability to be increased.

Here, FIG. 1A is a cross-sectional view of a portion in which the second p⁺-type region 4 is not provided. The second p⁺-type region 4 is selectively provided to be separated from the n⁻-type drift layer 1 and in contact with the first p⁺-type regions 3. Interfaces between the first p⁺-type region 3 and the second p⁺-type region 4 are provided closer to the source electrode 22 than are the respective bottoms of the trench gate 31 and the trench SBD 32. An upper side is a side toward the source electrode 22. The first p⁺-type region 3 is provided parallel to a direction Y (depicted in FIG. 1A) along which the trench gate 31 and the trench SBD 32 extend. The second p⁺-type region 4, as described hereinafter, is provided along a width direction X that is orthogonal to the direction Y along which the trench gate 31 and the trench SBD 32 extend.

Further, in the p-type base layer 16, the n⁺-type source region 17 and the third p⁺-type region (third semiconductor region of the second conductivity type) 18 are each selectively provided so as to be in contact with each other. A depth of the p⁺-type region 18, for example, may be equal to a depth of the n⁺-type source region 17 or may be deeper than the depth of the n⁺-type source region 17.

The trench gate 31 penetrates the n⁺-type source region 17 and the p-type base layer 16 from the base front surface and reaches the n-type region 15. On a trench gate 31 portion of the front surface of the silicon carbide base, i.e., on the n⁺-type source region 17 and the p⁺-type region 18, a metal film 33a of Ni, etc. is provided as an ohmic electrode. In the trench gate 31, the gate insulating film 19 is provided along a side wall of the trench gate 31 and the gate electrode 20 is provided on the gate insulating film 19. An end of the gate electrode 20, the end facing toward the source electrode 22, may or may not protrude out from the base front surface. The gate electrode 20 is electrically connected to a gate electrode pad by a gate pad region. An interlayer insulating film 21 is provided at the base front surface overall so as to cover the gate electrode 20 embedded in the trench gate 31.

The trench SBD 32 penetrates the n⁺-type source region 17, the p⁺-type region 18, and the p-type base layer 16 from the base front surface, and reaches the n-type region 15. In the trench SBD 32, a side wall of the trench SBD 32 is covered by a Schottky metal (a metal film 35) that connects the trench SBD 32 to the source electrode 22, whereby a Schottky junction between the n-type region 15 exposed at the inner wall and the Schottky metal (the metal film 35) is formed.

The source electrode 22 is in contact with the n⁺-type source region 17 and the p⁺-type region 18, via a contact hole opened in the interlayer insulating film 21 and is electrically insulated from the gate electrode 20 by the interlayer insulating film 21. Between the source electrode 22 and the interlayer insulating film 21, for example, a barrier metal that prevents diffusion of metal atoms from the source electrode 22 toward the gate electrode 20 may be provided. A source electrode pad (not depicted) is provided on the source electrode 22. On the rear surface (rear surface of the n⁺-type silicon carbide substrate 2 constituting an n⁺-type drain region) of the silicon carbide base, the drain electrode (not depicted) is provided.

The p⁺-type region 18 is provided between the source electrode 22 and the p-type base layer 16. In the example depicted in FIG. 1B, the p⁺-type regions 18 are disposed having a predetermined length, alternating on each side in the width direction of the trench SBD 32, along a direction (the direction Y) in which the trench SBD 32 is provided.

In this manner, by providing the p⁺-type region 18 of a high impurity concentration between the source electrode 22 and the p-type base layer 16, the p-type base layer 16 and the source electrode 22 are connected via the p⁺-type region 18 and the metal film (ohmic electrode) 33a. As a result, resistance between the source electrode 22 and a channel p layer may be reduced, and electric potential of the p-type base layer 16 may be stabilized. Further, contact resistance between the source electrode 22 and the channel p layer decreases, thereby enabling prevention of both threshold variation at the time of switching and decreases in avalanche resistance.

A method of manufacturing the semiconductor device according to the embodiment will be described. FIGS. 2, 3A, 3B, 4A, 4B, 5, 6, 7, 8, 9, 10, 11, 12, 13, 14, and 15 are cross-sectional views and top views of the silicon carbide semiconductor device according to the embodiment during manufacture. First, as depicted in FIG. 2, the n⁺-type silicon carbide substrate 2 that constitutes the n⁺-type drain region is prepared. Next, at the front surface of the n⁺-type silicon carbide substrate 2, the n⁻-type drift layer 1 described above is formed by epitaxial growth. For example, when breakdown voltage is 1200V, conditions of the epitaxial growth for forming the n⁻-type drift layer 1 may be set so that the impurity concentration of the n⁻-type drift layer 1 is in a range from about $5 \times 10^{15}/cm^3$ to $1 \times 10^{16}/cm^3$, and a formed thickness (depth) is in a range from about 8 to 12 μm.

Next, as depicted in FIG. 3A (cross-sectional view along cutting line A-A' in FIG. 3B), on the n⁻-type drift layer 1, an oxide film mask is formed by photolithography and etching and, for example, aluminum (Al) is ion implanted as p-type impurity at a temperature of 500 degrees C., thereby forming the first p⁺-type region (PB1) 3. For example, a dose amount during the ion implantation for forming the first p⁺-type region 3 may be set so that the impurity concentration thereof is in a range from $1 \times 10^{18}/cm^3$ to $5 \times 10^{18}/cm^3$ and the thickness thereof is in a range from about 0.3 μm to 0.8 μm.

Further, an oxide film mask is formed by photolithography and etching and, for example, nitrogen (N) is ion implanted as an n-type impurity at room temperature, thereby forming a lower n-type region 15a. The lower n-type region 15a is a portion of the n-type region 15 and together with an upper n-type region 15b described hereinafter forms the n-type region 15. For example, conditions are set so that the lower n-type region 15a has an impurity concentration in a range from about $5 \times 10^{16}/cm^3$ to $3 \times 10^{17}/cm^3$ and a thickness in a range from about 0.3 μm to 0.8 μm. A sequence in which the first p⁺-type region (PB1) 3 and the lower n-type region 15a are formed may be interchanged.

Alternatively, on the n⁻-type drift layer 1, the lower n-type region 15a may be formed by epitaxial growth and subsequently, by photolithography and ion implantation of a p-type impurity, the first p⁺-type region 3 may be selectively formed in a surface layer of the lower n-type region 15a.

FIG. 3B is a top view of the structure depicted in FIG. 3A. For example, the first p⁺-type region (PB1) 3 is formed to be about 1.5 μm in the width direction X and the lower n-type region 15a is formed to be about 1.0 μm in the width direction X. The first p$^+$-type region (PB1) 3 is formed between the lower n-type regions 15a so as to extend along the direction Y.

Next, as depicted in FIG. 4A (cross-sectional view along cutting line A-A' in FIG. 4B), an oxide film mask is formed on the lower n-type region 15a by photolithography and etching and, for example, aluminum (Al) is ion implanted as a p-type impurity at 500 degrees, thereby forming the second p$^+$-type region (PB2) 4. For example, a dose amount during the ion implantation for forming the second p$^+$-type region 4 is set so that the impurity concentration thereof is in a range from $1 \times 10^{18}/cm^3$ to $5 \times 10^{18}/cm^3$ and the depth thereof is in a range from about 0.3 μm to 0.8 μm.

Further, by photolithography and etching, an oxide film mask is formed and, for example, nitrogen (N) is ion implanted as an n-type impurity at room temperature, thereby forming the lower n-type region 15a. The lower n-type region 15a is a portion of the n-type region 15. For example, conditions are set so that the lower n-type region 15a has an impurity concentration that is in a range from about $5 \times 10^{16}/cm^3$ to $3 \times 10^{17}/cm^3$ and a depth that is in a range from about 0.3 μm to 0.8 μm. A sequence in which the second p$^+$-type region (PB2) 4 and the upper n-type region 15b are formed may be interchanged.

Alternatively, on the lower n-type region 15a, the upper n-type region 15b may be formed by epitaxial growth and subsequently, by photolithography and ion implantation of a p-type impurity, the second p$^+$-type region 4 may be selectively formed in the surface layer of the lower n-type region 15a.

FIG. 4B is a top view of the structure depicted in FIG. 4A. For example, the second p$^+$-type region (PB2) 4 is formed to be about 1.0 μm in the direction Y and the upper n-type region 15b is formed to be in a range from about 10 μm to 100 μm in the direction Y. The second p$^+$-type region (PB2) 4 is formed between the upper n-type regions 15b so as to extend along the width direction X. As a result, the first p$^+$-type region (PB1) 3 is connected to the second p$^+$-type region (PB2) 4 at a predetermined pitch.

Next, as depicted in FIG. 5, on the upper n-type region 15b and the second p$^+$-type region 4, the p-type base layer 16 is formed by epitaxial growth. For example, conditions of the epitaxial growth for forming the p-type base layer 16 may be set so that the p-type base layer 16 has an impurity concentration that is in a range from about $8 \times 10^{16}/cm^3$ to $4 \times 10^{17}/cm^3$.

Next, an oxide film mask is formed by photolithography and etching and an n-type impurity such as phosphorus (P) is ion implanted at a temperature of 500 degrees C., thereby selectively forming the n$^+$-type source region 17 in a surface layer of the p-type base layer 16. For example, a dose amount during the ion implantation for forming the n$^+$-type source region 17 is set so that the impurity concentration thereof is in a range from about $1 \times 10^{19}/cm^3$ to $1 \times 10^{21}/cm^3$ and the depth thereof is in a range from about 0.1 μm to 0.8 μm.

Next, an oxide film mask is formed by photolithography and etching and a p-type impurity such as aluminum (Al) is ion implanted, whereby in the surface layer of the p-type base layer 16, the p$^+$-type region 18 is selectively formed so as to be in contact with the n$^+$-type source region 17. For example, a dose amount during the ion implantation for forming the p$^+$-type region 18 is set so that the impurity concentration thereof is in a range from about $1 \times 10^{19}/cm^3$ to $1 \times 10^{21}/cm^3$ and the depth thereof is in a range from about 0.3 μm to 1.0 μm. A sequence in which the n$^+$-type source region 17 and the p$^+$-type region 18 are formed may be interchanged. After all of the ion implantations have been completed, activation annealing is performed.

Figure 6:
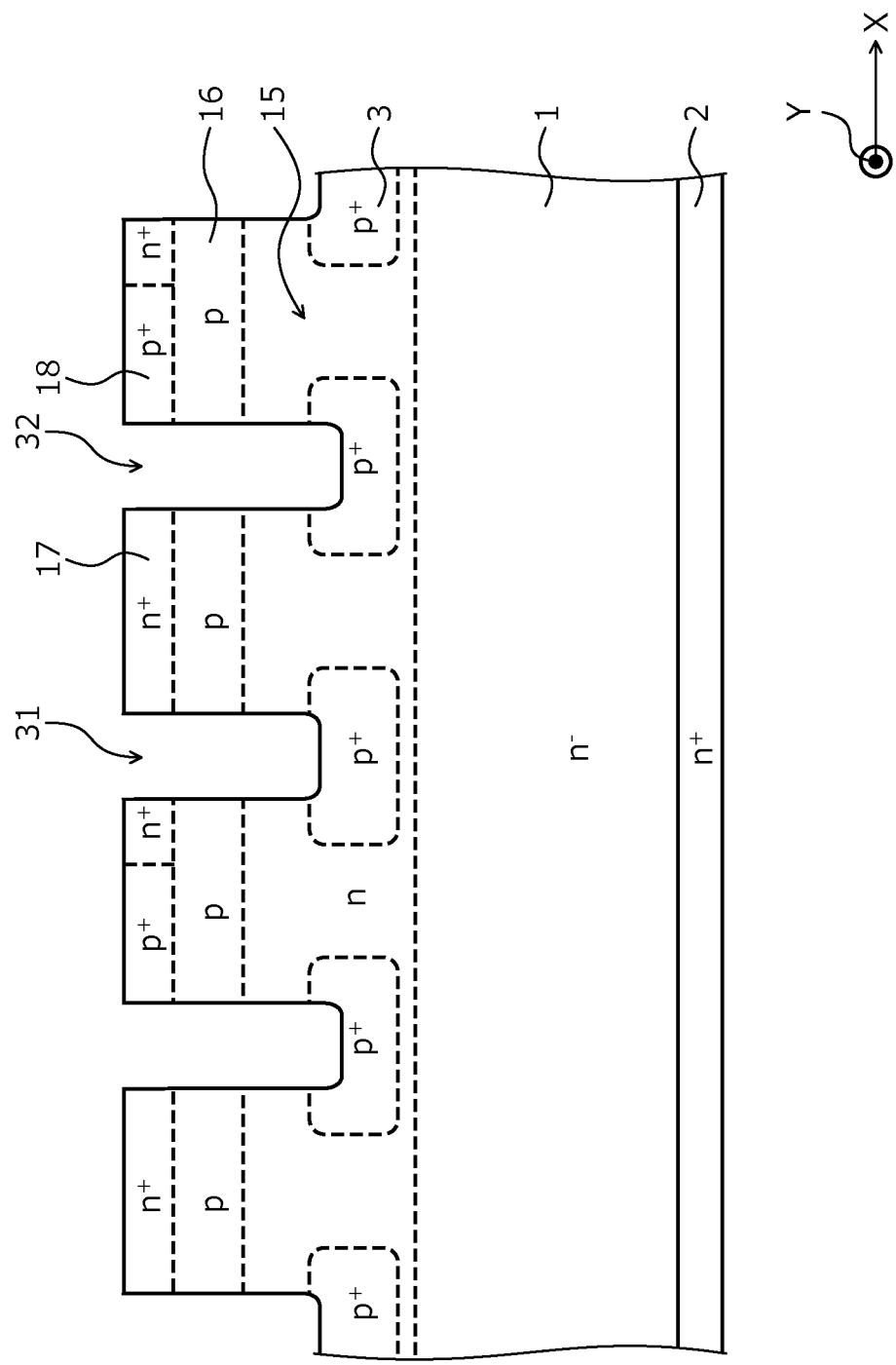
FIG. 6 is a cross-sectional view of the silicon carbide semiconductor device according to the embodiment during manufacture.

Next, as depicted in FIG. 6, an oxide film mask is formed by photolithography and etching, and by dry etching, the trench gate 31 is formed to penetrate the p-type base layer 16 and reach the n-type region 15. The n$^+$-type source region 17 and the p$^+$-type region 18 are positioned in both side portions of the trench gate 31.

The trench gate 31 has a bottom that may reach the first p$^+$-type region 3 or may reach a position that is in the n-type region 15 and between the p-type base layer 16 and the first p$^+$-type region 3. Subsequently, the mask used for forming the trench gate 31 is removed. Further, an oxide film is used as the mask during trench formation. After the trench etching, isotropic etching for removing damage of the trench gate 31 and/or hydrogen annealing for rounding corners of an opening of the trench gate 31 and the bottom of the trench gate 31 may be performed (refer to FIG. 7). Any one of isotropic etching and hydrogen annealing alone may be performed. Alternatively, hydrogen annealing may be performed after isotropic etching is performed, whereby the trench surface may be smoothed.

Next, the trench SBD 32 is formed by photolithography and etching to penetrate the p-type base layer 16 and reach the n-type region 15. As depicted in FIG. 6, the n$^+$-type source region 17 and the p$^+$-type region 18 are positioned in both side portions of the trench gate 31.

Here, as viewed from a top surface, as depicted in FIG. 1B, with respect to the direction (the direction Y) along which the trench SBD 32 is formed, the p$^+$-type regions 18 are disposed in both side portions of the trench SBD 32, at the predetermined length so as to be staggered. As a result, assuming that a center position of the trench SBD 32 deviates from a center position between the p$^+$-type regions 18 in both side portions, formation between the p$^+$-type regions 18 in both side portions is possible and therefore, contact with the trench SBD 32 is possible.

The bottom of the trench SBD 32 may reach the first p$^+$-type region 3 or may reach a position that is in the n-type region 15 and between the p-type base layer 16 and the first p$^+$-type region 3. Subsequently, the mask used for forming the trench SBD 32 is removed.

Figure 7:
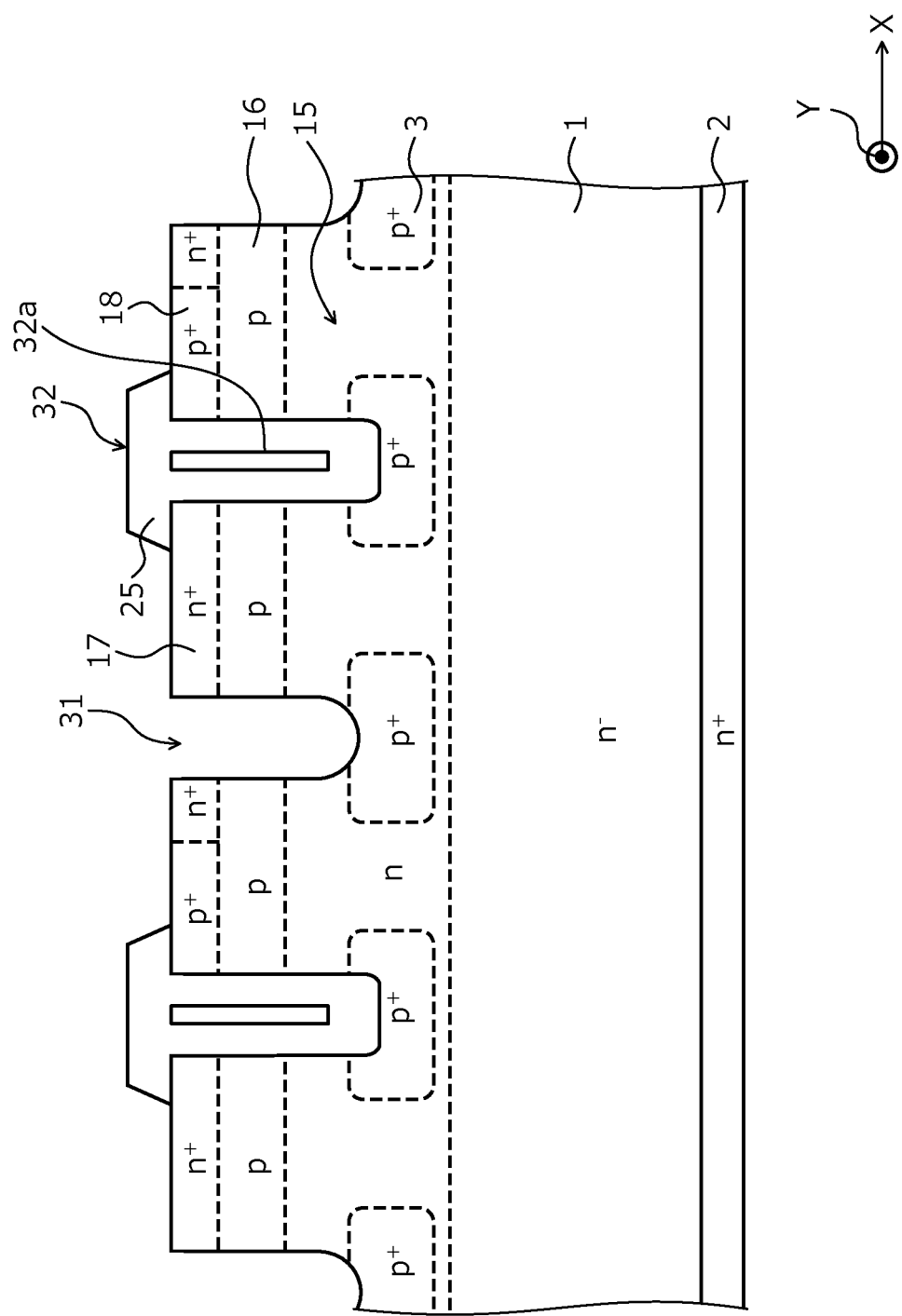
FIG. 7 is a cross-sectional view of the silicon carbide semiconductor device according to the embodiment during manufacture.

Next, as depicted in FIG. 7, the trench SBD 32 is embedded with an oxide film 25 of silicon dioxide (SiO$_2$) or the like. For example, by photolithography and etching, the oxide film 25 is patterned at a portion of the trench SBD 32 and a field oxide film is formed by sacrificial oxidation and chemical vapor deposition (CVD). Here, a sacrificial oxide film is attached to an interface of the side wall of the trench SBD 32. When coverage during oxide film deposition is poor, a "cavity (space)" 32a occurs in the oxide film 25.

Figure 8:
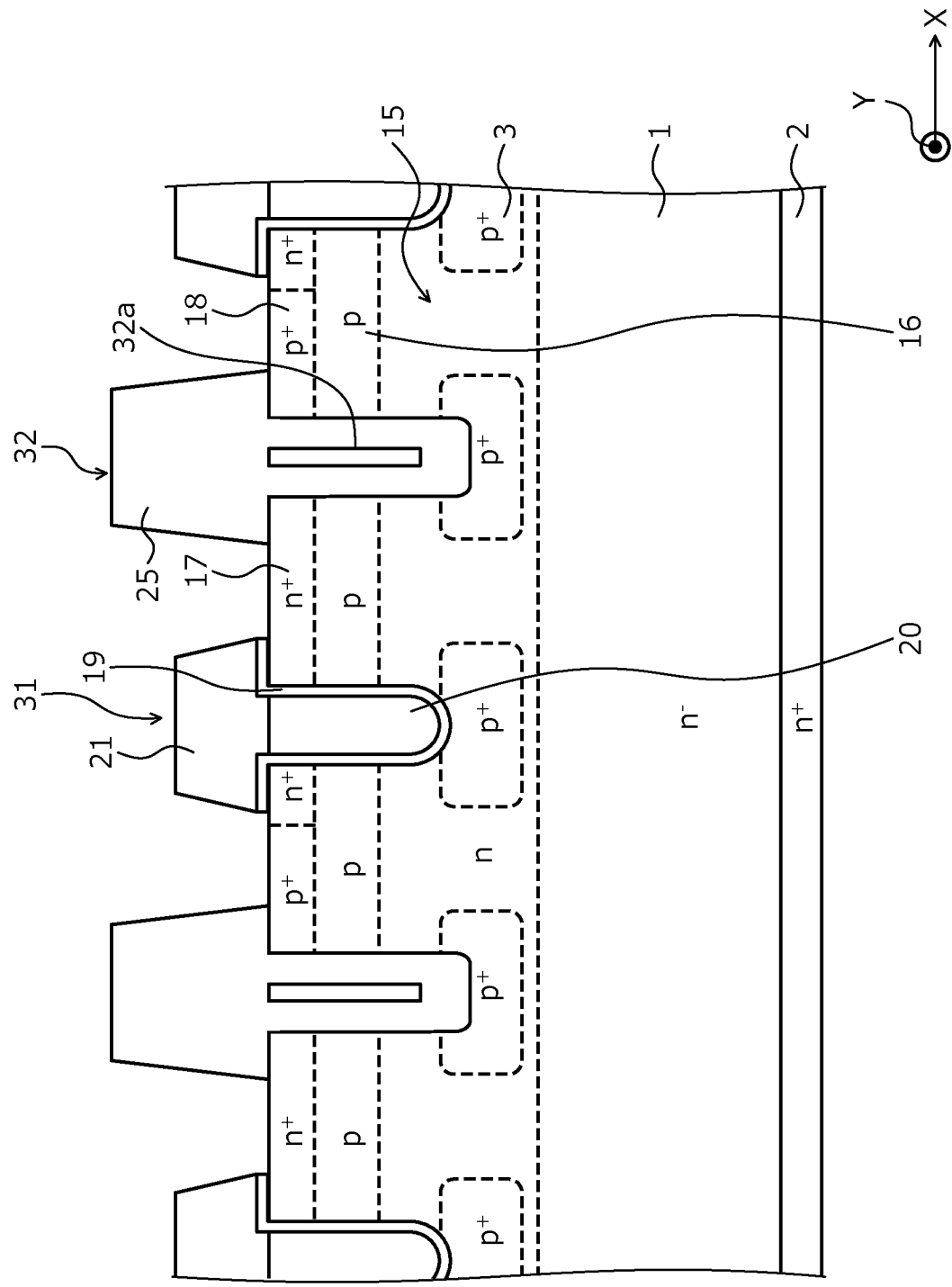
FIG. 8 is a cross-sectional view of the silicon carbide semiconductor device according to the embodiment during manufacture.

Next, as depicted in FIG. 8, the gate electrode 20 is formed in the trench gate 31. Here, along the front surface of the silicon carbide base and the inner wall of the trench gate 31, the gate insulating film 19 is formed. Next, for example, after poly-silicon is deposited so as to be embedded in the trench gate 31, patterning and etching are performed so that the poly-silicon in the trench gate 31 remains, thereby forming the gate electrode 20 in the trench gate 31. Here, the etching may be performed by etch back so that the remaining poly-silicon is deeper than the substrate surface, or may be performed by patterning and etching so that the poly-silicon protrudes outward beyond the substrate surface.

Further, a gate oxide film is formed by a high temperature oxide (HTO) and a heat treatment is performed by post oxidation annealing (POA) in an atmosphere containing nitrogen oxide (NO) gas.

Next, the interlayer insulating film 21 is formed at the front surface of the silicon carbide base overall so as to cover the gate electrode 20. The interlayer insulating film 21, for example, is patterned and formed after a silicon oxide ($SiO_2$) is deposited. Further, the interlayer insulating film 21 may be formed by a non-doped silicate glass (NSG), a phosphosilicate glass (PSG), a borophosphosilicate glass (BPSG), a high temperature oxide (HTO), or a combination thereof. When poly-silicon penetrates and is deposited in the "cavity" 32a in the trench SBD 32, the poly-silicon is removed by additional etching after the interlayer insulating film 21 is formed.

Figure 9:
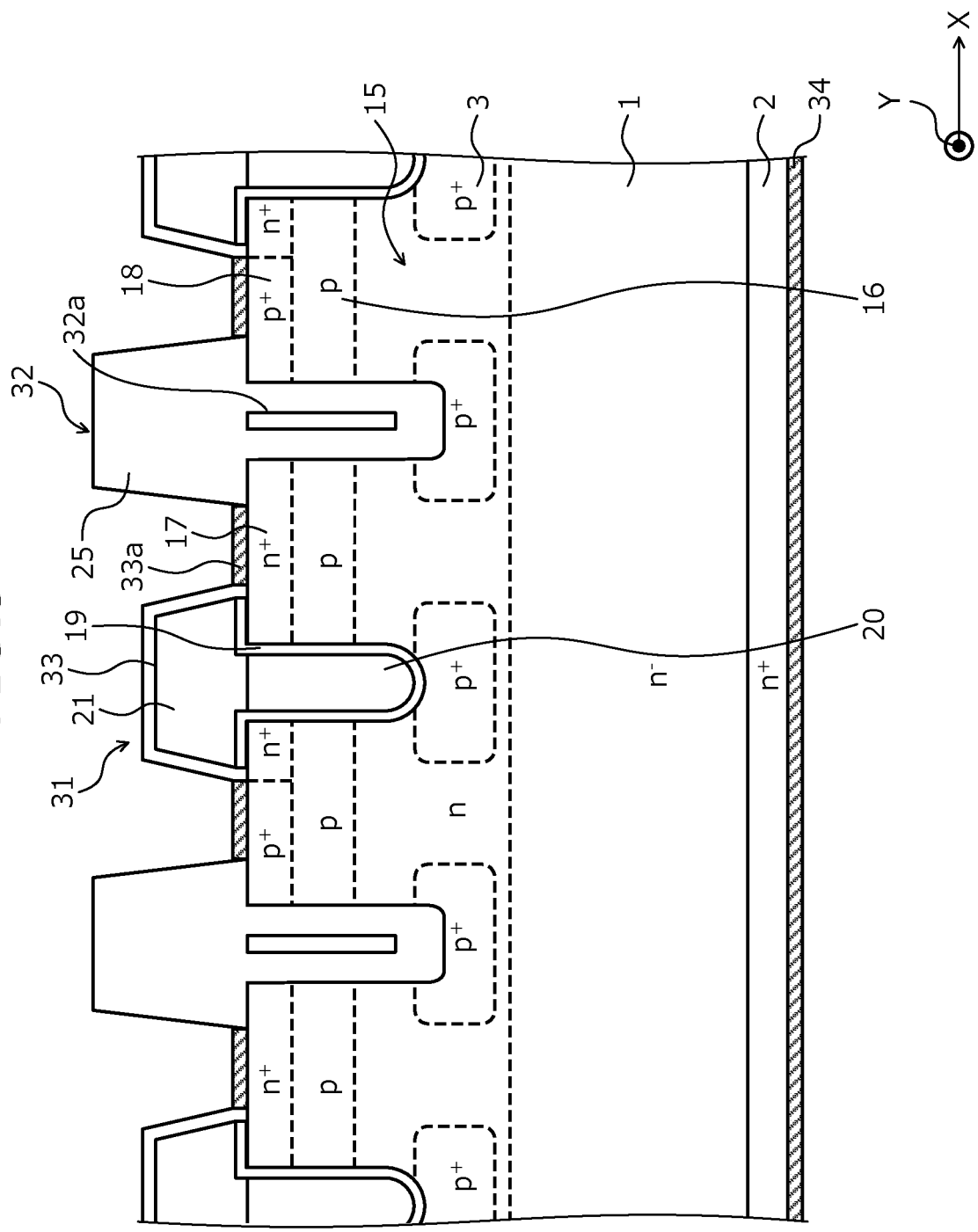
FIG. 9 is a cross-sectional view of the silicon carbide semiconductor device according to the embodiment during manufacture.

Next, as depicted in FIG. 9, a metal film 33, for example, titanium (Ti) or nickel (Ni) is deposited on the front surface of the silicon carbide base overall, a heat treatment (annealing) is performed in a nitrogen ($N_2$) atmosphere of a temperature in a range from about 400 degrees to 600 degrees. Further, the metal film 33 is removed by wet etching so that only the metal film 33a remains on the front surface of the silicon carbide base, as a NiSi layer that is an alloy containing Ni and Si.

Further, on the rear surface of the $n^+$-type silicon carbide substrate 2, a nickel (Ni) film, a titanium (Ti) film, a silicon (Si) film, etc. are deposited at a contact portion of the drain electrode by sputter deposition, whereby the metal film 34 is formed. The metal film 34 may be stacked layers of Ni/Ti, Ni/Si, Ti/Si that are combinations of a Ni film, a Ti film, and a Si film. Thereafter, a heat treatment at a temperature in a range from about 800 degrees to 1000 degrees is performed. As a result, the metal film 33a at the surface and containing N and the metal film 34 at the rear surface and containing Ni/Si constitute an ohmic electrode.

Figure 10:
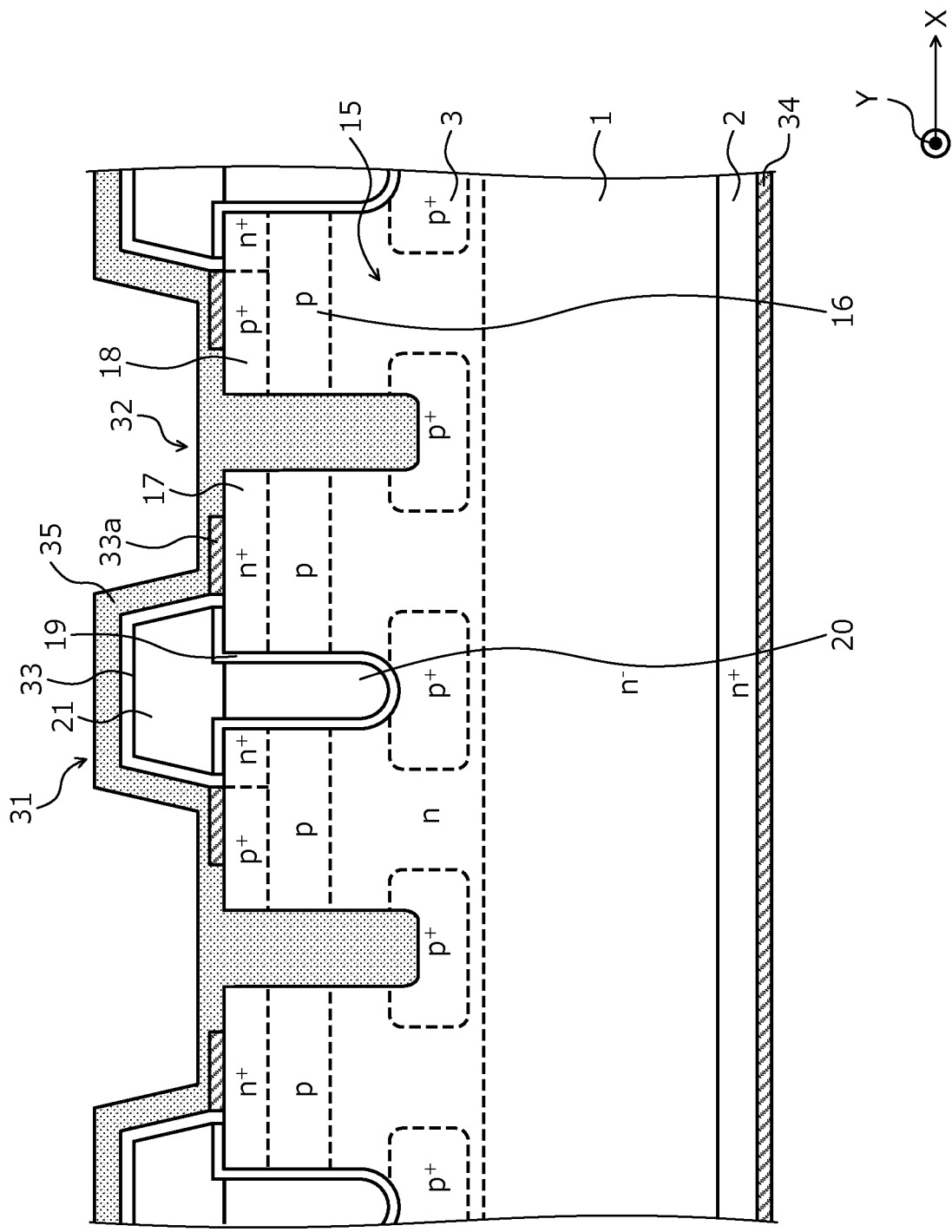
FIG. 10 is a cross-sectional view of the silicon carbide semiconductor device according to the embodiment during manufacture.

Next, as depicted in FIG. 10, after the oxide film 25 at the trench SBD 32 is removed by patterning and etching, the metal film 35, for example, containing titanium (Ti), tungsten (W), nickel (Ni), molybdenum (Mo) is formed on the front surface of the silicon carbide base overall. The metal film 35 is deposited in the trench SBD 32. Thereafter, a Schottky junction between the metal film 35 and a semiconductor region (the n-type region 15) is formed at the side wall of the trench SBD 32 by a heat treatment (annealing) in a nitrogen ($N_2$) atmosphere at a temperature in a range from, for example, about 400 degrees C. to 800 degrees C.

Figure 11:
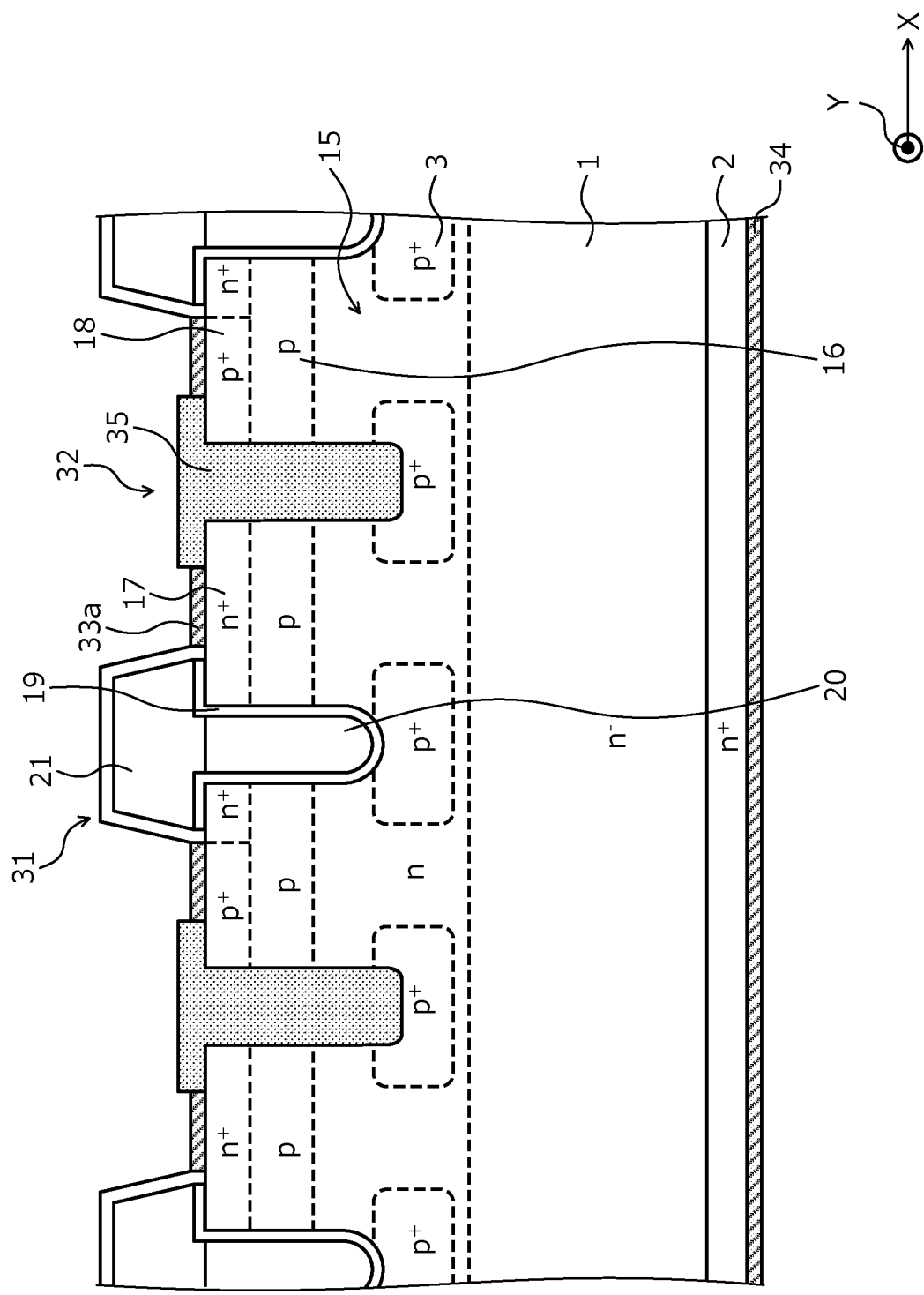
FIG. 11 is a cross-sectional view of the silicon carbide semiconductor device according to the embodiment during manufacture.
Figure 12:
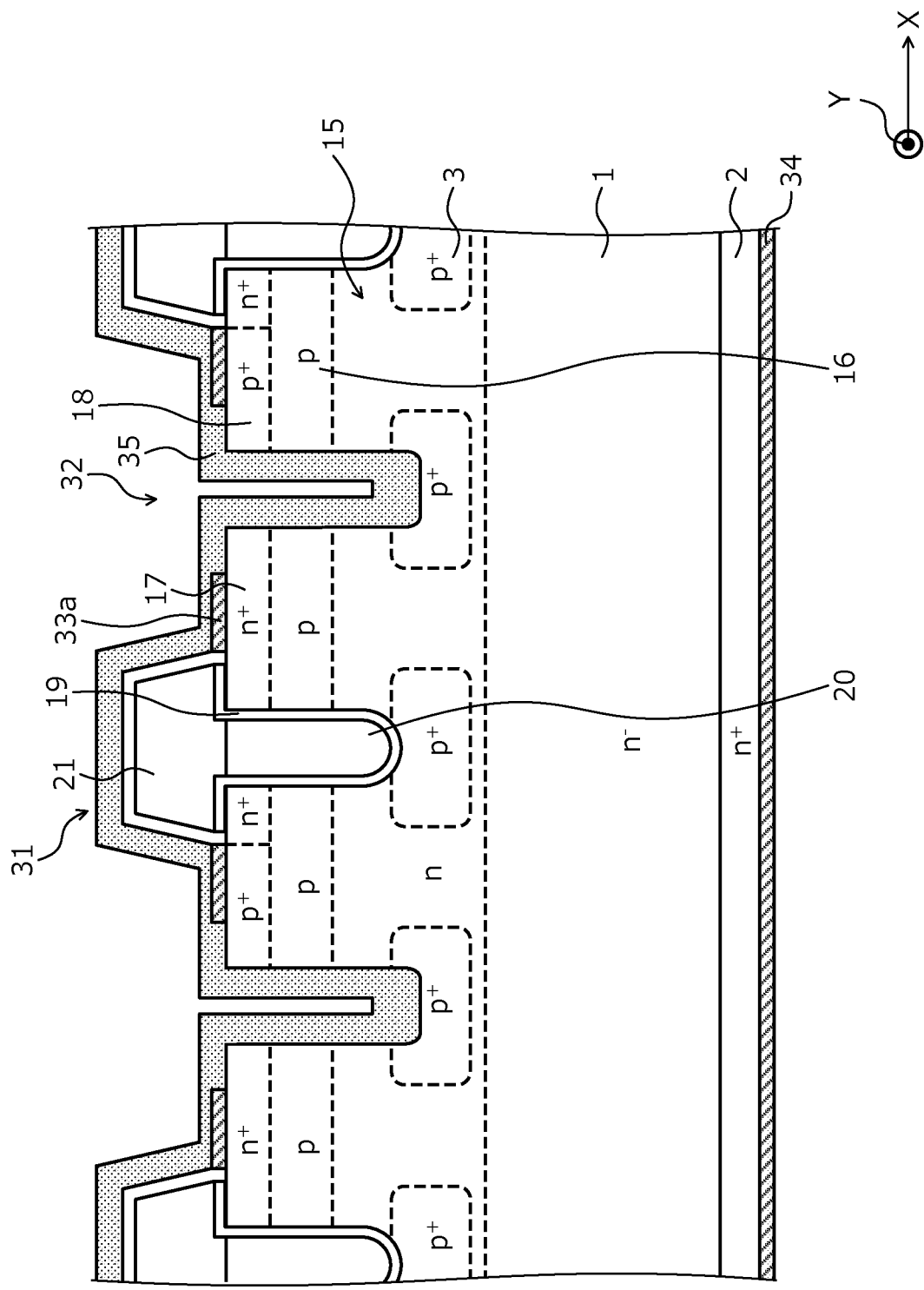
FIG. 12 is a cross-sectional view of the silicon carbide semiconductor device according to the embodiment during manufacture.

The metal film 35 at the side wall of the trench SBD 32 suffices to be joined to the semiconductor region (the n-type region 15). Therefore, as depicted in FIG. 11, the metal film 35 other than an active portion thereof may be removed by patterning and in the present example, the metal film 35 remains in and on top of the trench SBD 32 while the trench gate 31 portion is removed. Further, as depicted in FIG. 12, the metal film 35 may be formed only at the side wall of the trench SBD 32 and in this case as well, a Schottky junction may be formed between the metal film 35 at the side wall of the trench SBD 32 and a semiconductor region (the n-type region 15). Thereafter, the interlayer insulating film 21 and the gate insulating film 19 are patterned, thereby forming a contact hole and exposing the $n^+$-type source region 17 and the $p^+$-type region 18.

Figure 13:
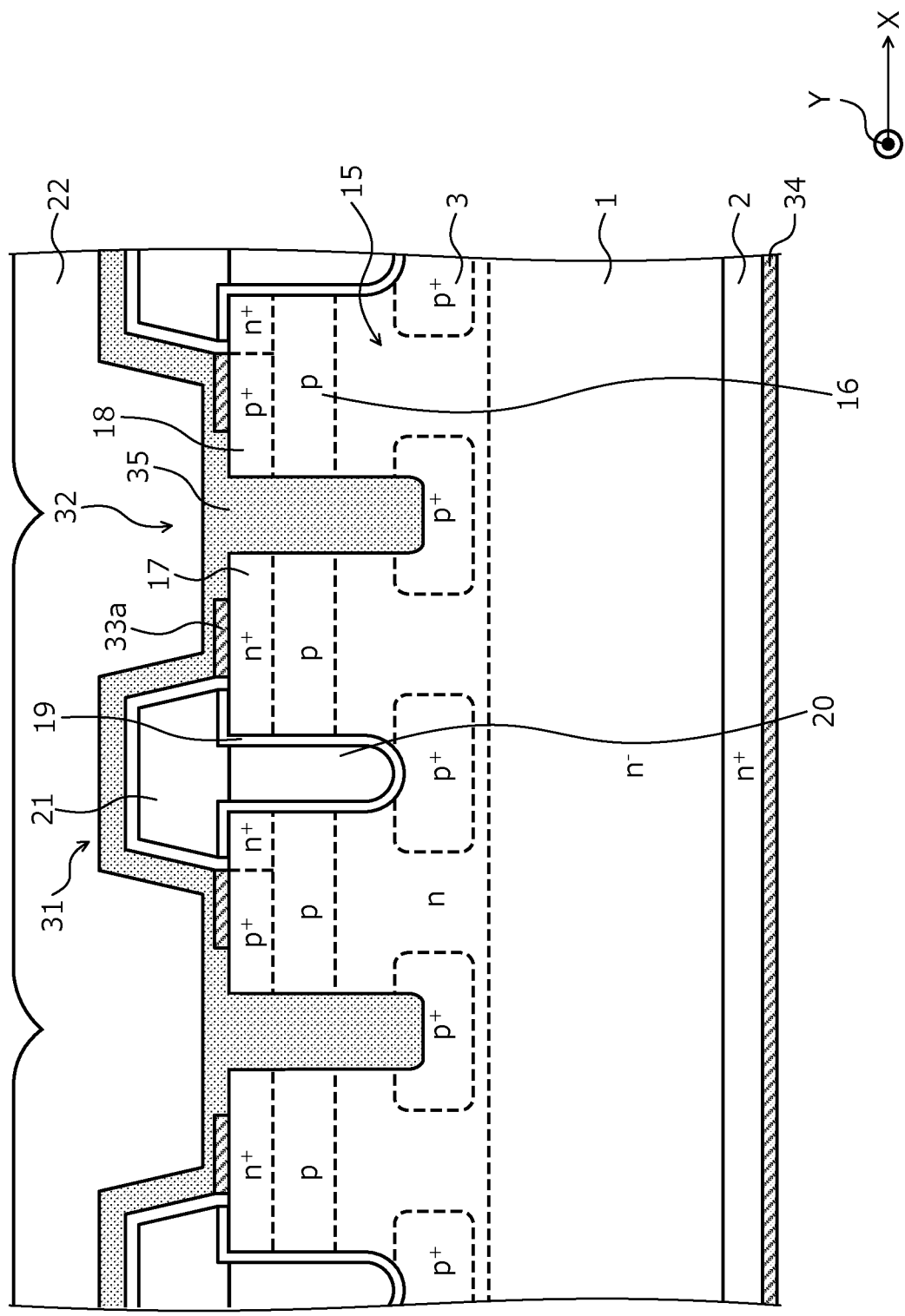
FIG. 13 is a cross-sectional view of the silicon carbide semiconductor device according to the embodiment during manufacture.
Figure 14:
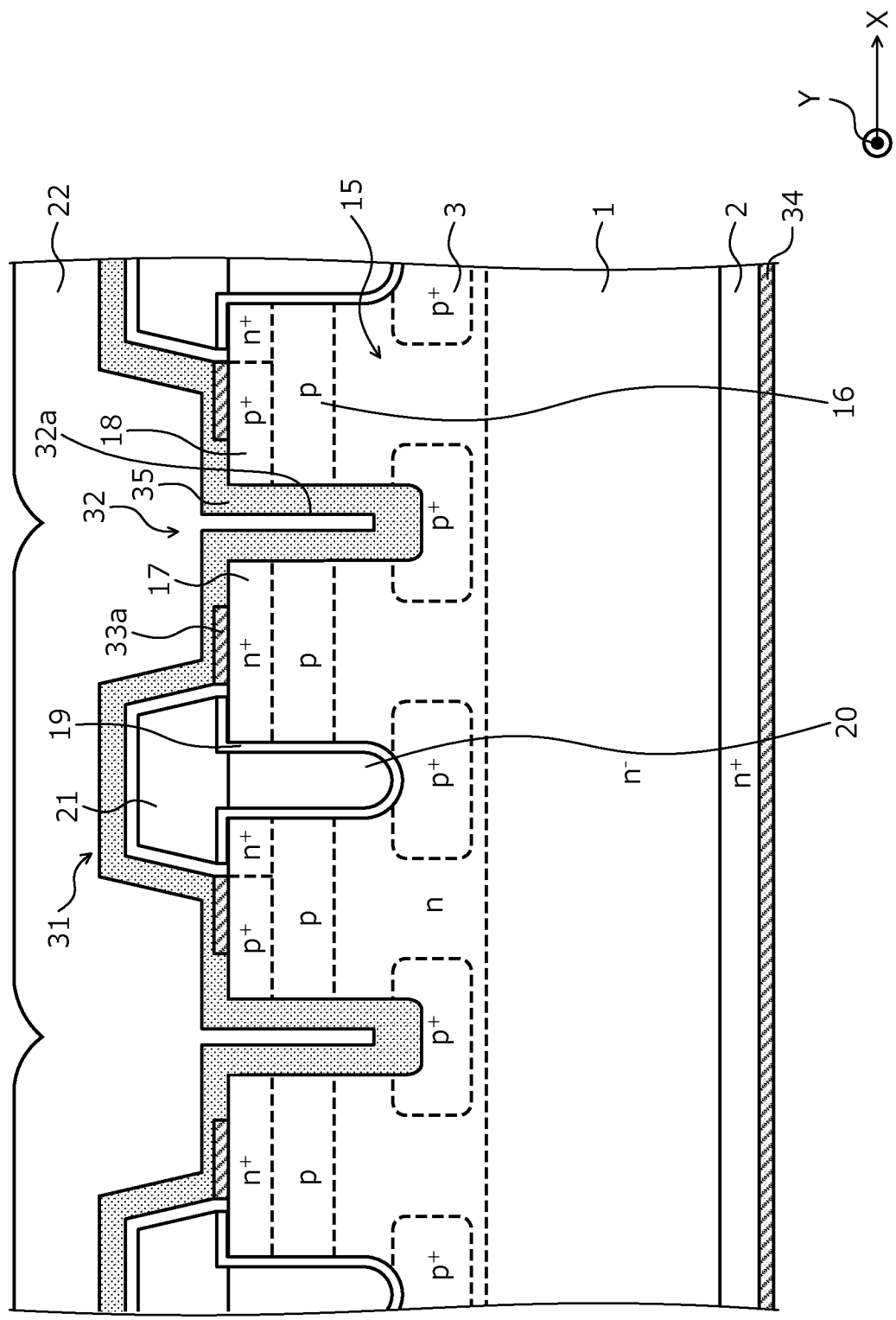
FIG. 14 is a cross-sectional view of the silicon carbide semiconductor device according to the embodiment during manufacture.

Next, as depicted in FIG. 13, the source electrode 22 is formed on the front surface of the silicon carbide base overall by aluminum (Al), etc. Next, the source electrode pad is formed so as to be embedded in the contact hole. A portion of a metal layer deposited for forming the source electrode pad may be used as the gate electrode pad. Thereafter, a thick film such as a stacked film in which, for example, a Ti film, a Ni film, and gold (Au) are sequentially stacked is formed by electron beam (EB) vapor deposition, thereby forming the drain electrode. Thereafter, a polyimide is deposited and patterned.

In the epitaxial growth and ion implantations described above, for example, nitrogen (N), phosphorus (P), arsenic (As), antimony (Sb), etc. that are an n-type with respect to silicon carbide suffices to be used as an n-type impurity (n-type dopant). For example, boron (B), aluminum (Al), gallium (Ga), indium (In), thallium (Tl), etc. that are a p-type with respect to silicon carbide may be used as a p-type impurity (p-type dopant). In this manner, the MOSFET depicted in FIGS. 1A and 1B is completed.

Figure 15:
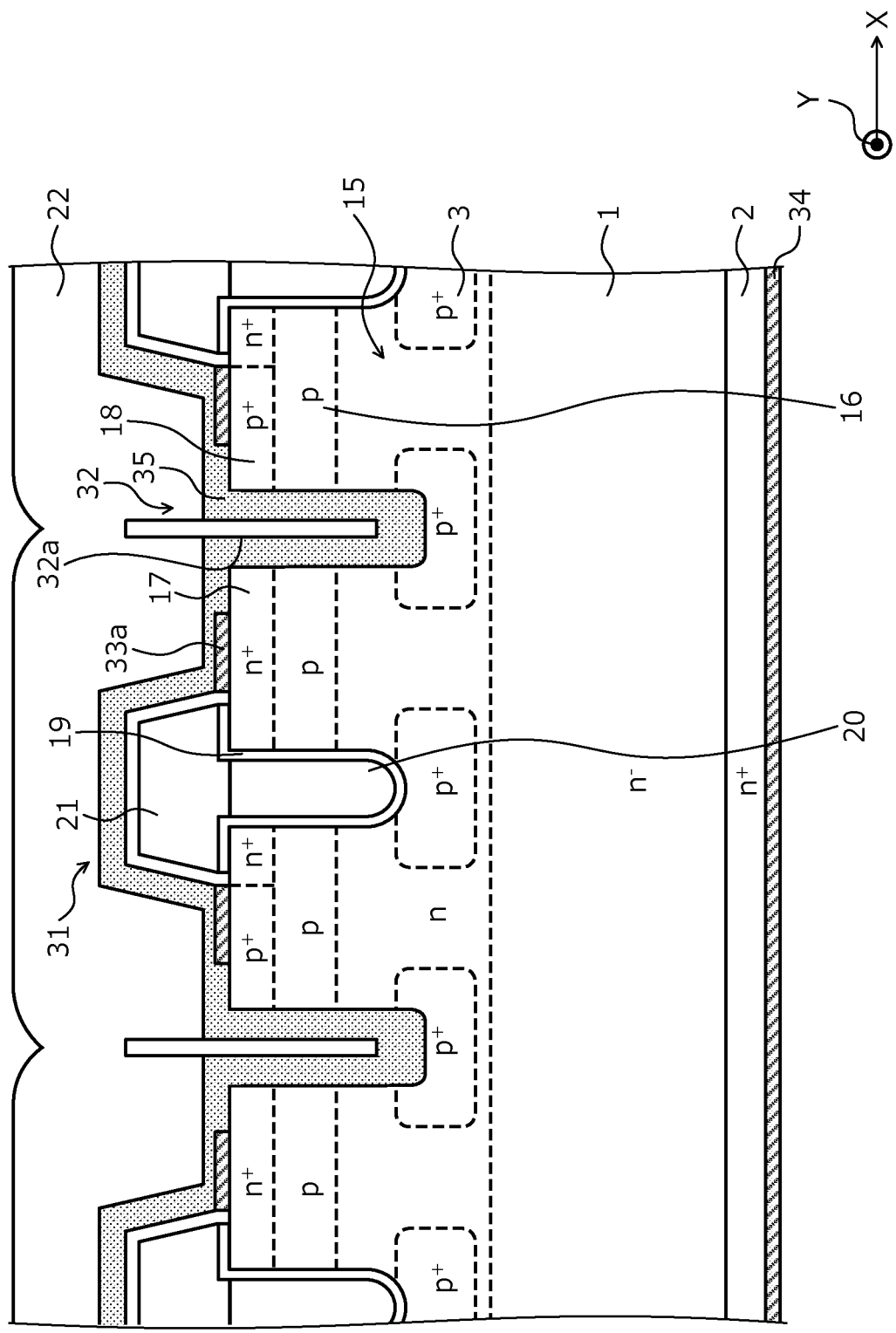
FIG. 15 is a cross-sectional view of the silicon carbide semiconductor device according to the embodiment during manufacture.

In the manufacturing processes described above, as depicted in FIG. 14, when the "cavity" 32a occurs in the trench SBD 32 (equivalent to the state depicted in FIG. 12), the portion containing the "cavity" 32a may be embedded with a metal (Al, etc.) of the source electrode 22. Further, as depicted in FIG. 15, even when the "cavity" 32a occurs in a metal (Al, etc.) portion of the embedded source electrode 22, no adverse effects occur in particular.

FIGS. 16A, 16B, 17A, 17B, 18Aa, 18Ab, 18B, 19, 20, 21, 22, and 23 are top views and cross-sectional views of other structures of the silicon carbide semiconductor device according to the embodiment. With reference to these drawings, other configuration examples of the embodiment will be described. In the description hereinafter, mainly differences from the structure depicted in FIGS. 1A and 1B will be described.

Figure 16A:
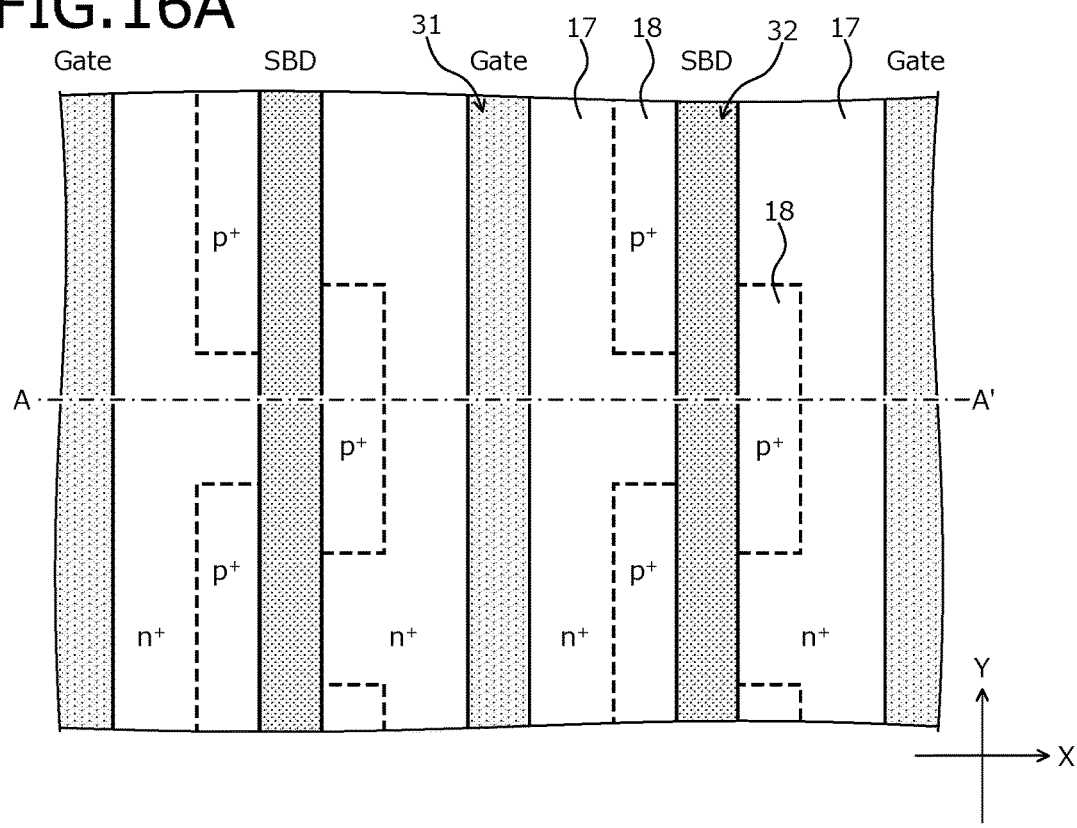
FIG. 16A is a top view of another structure of the silicon carbide semiconductor device according to the embodiment.
Figure 16B:
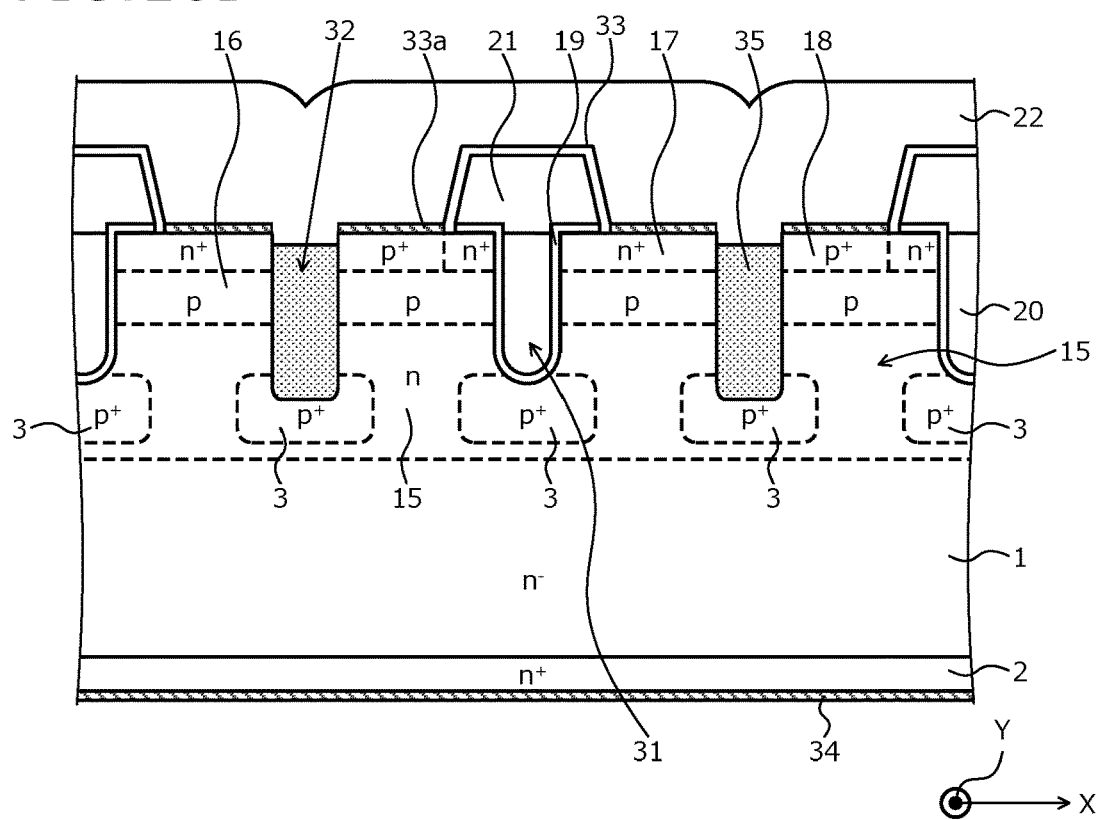
FIG. 16B is a cross-sectional view of the silicon carbide semiconductor device depicted in FIG. 16A.

FIG. 16A is a top view of a MOSFET and FIG. 16B is a cross-sectional view along cutting line A-A' in FIG. 16A. While the MOSFET depicted in FIG. 16A (when depicted in the top view) has a structure similar to that depicted in FIG. 1B, as depicted in FIG. 16B, the metal film 35 is embedded in the trench SBD 32 to a position at about a height of the opening of the trench SBD 32. In this case, the metal film 33a may be formed wider on the front surface side, thereby enabling a mathematical area of an ohmic contact to be increased.

Figure 17A:
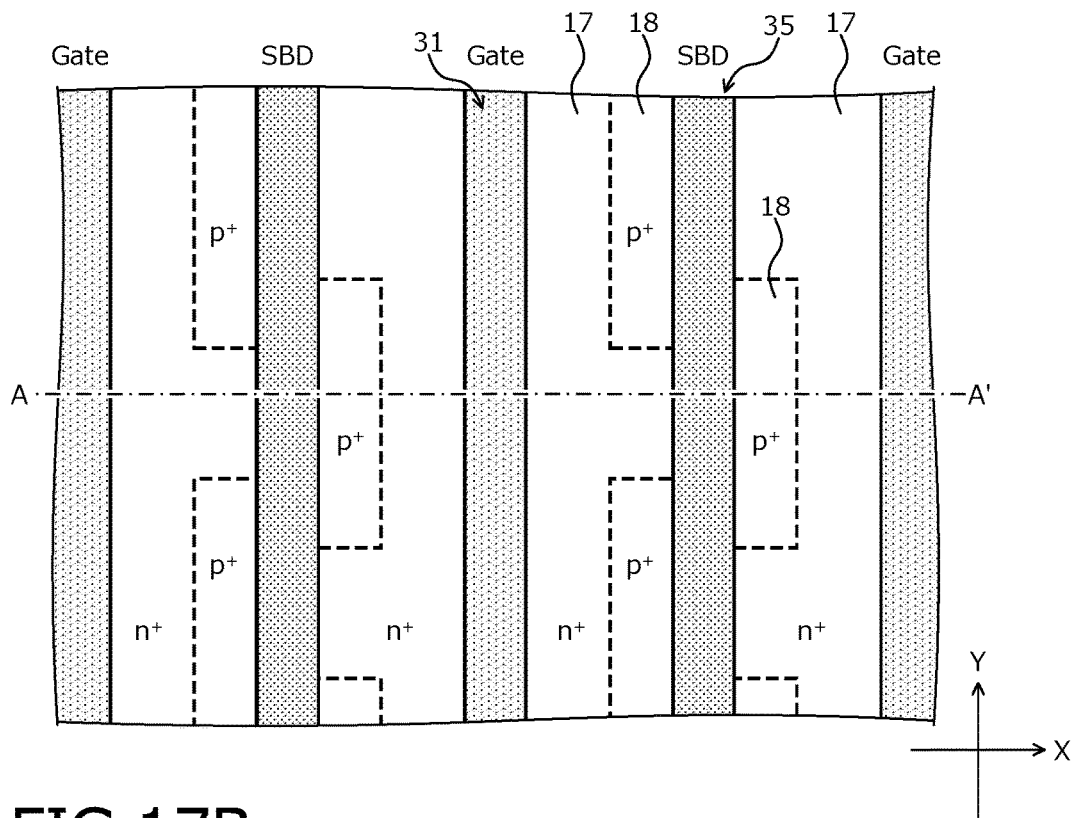
FIG. 17A is a top view of another structure of the silicon carbide semiconductor device according to the embodiment.
Figure 17B:
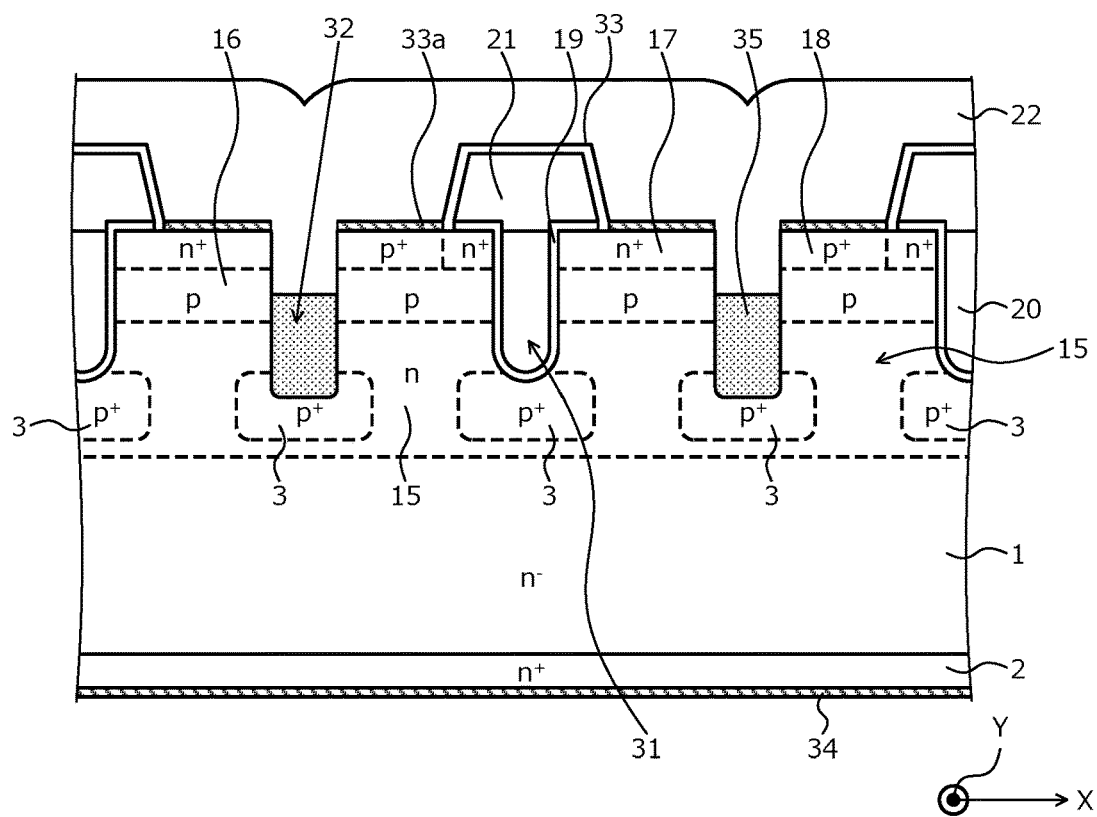
FIG. 17B is a cross-sectional view of the silicon carbide semiconductor device depicted in FIG. 17A.

FIG. 17A is a top view of a MOSFET and FIG. 17B is a cross-sectional view along cutting line A-A' in FIG. 17A. While the MOSFET depicted in FIG. 17A (when depicted in the top view) has a structure similar to that depicted in FIG. 1B, as depicted in FIG. 17B, the metal film 35 is embedded in the trench SBD 32 to about an intermediate position (e.g., position at a height of the p-type base layer 16) of the trench SBD 32. In this case as well, the metal film 33a may be formed wider on the front surface side, thereby enabling the mathematical area of the ohmic contact to be increased.

Figure 18A:
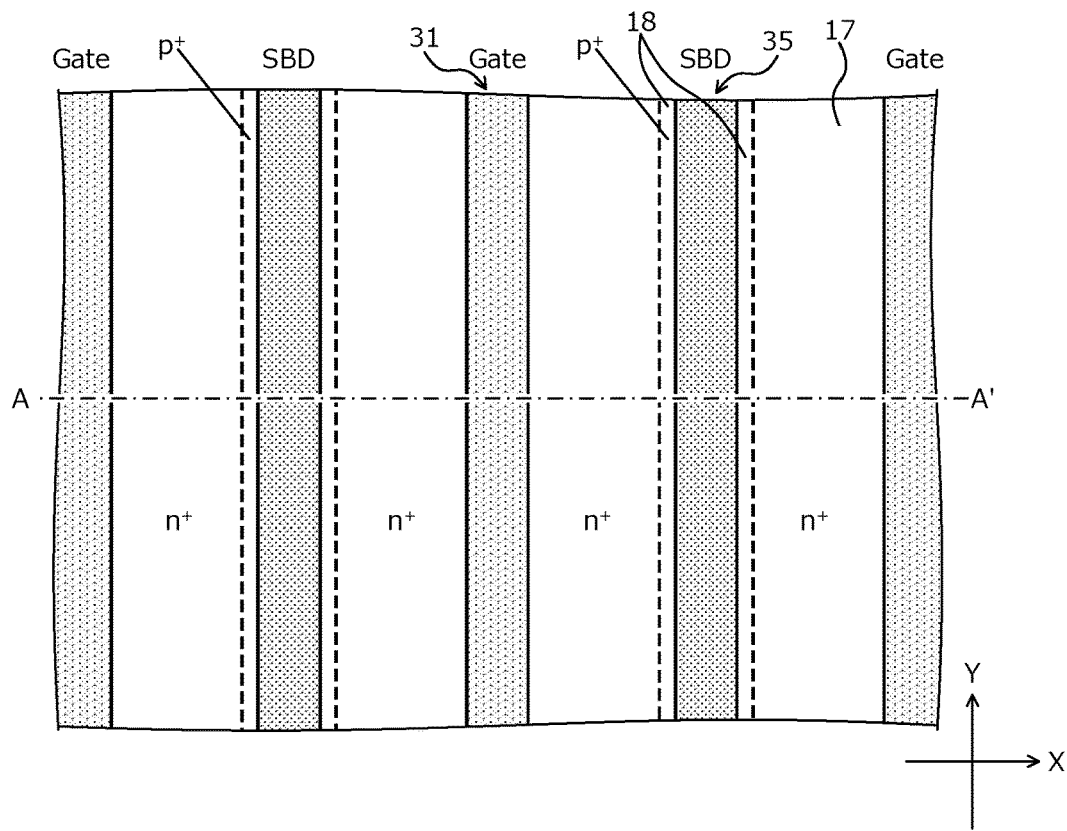
FIG. 18Aa is a top view of another structure of the silicon carbide semiconductor device according to the embodiment.
Figure 18A:
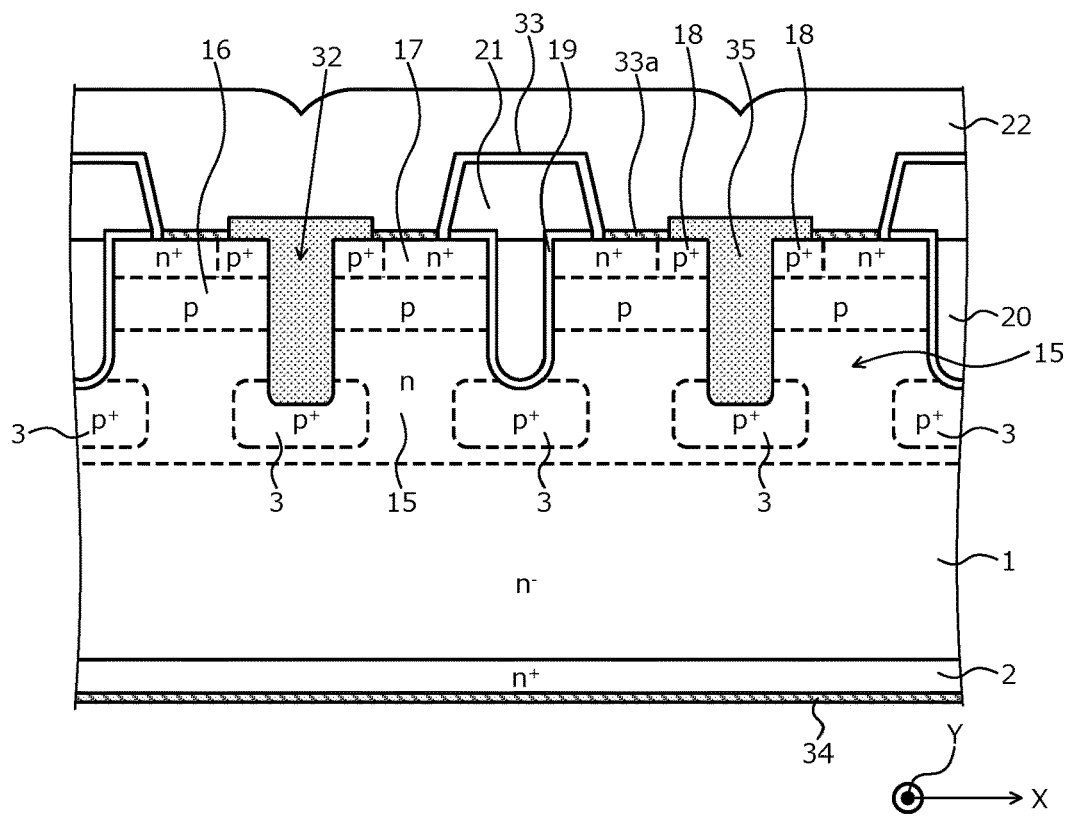

FIG. 18Aa is a top view of a MOSFET and FIG. 18Ab is a cross-sectional view along cutting line A-A' in FIG. 18Aa. In the MOSFET depicted in FIGS. 18Aa and 18Ab, the $p^+$-type regions 18 are formed to be continuous along both side portions along the direction (the direction Y) in which the trench SBD 32 is provided. Further, as depicted in FIG. 18Ab, the metal film 35 is provided on a front surface of the trench SBD 32. The $p^+$-type region 18, as described above, is selectively formed by forming an oxide film mask by photolithography and etching, and forming the $p^+$-type region 18 in the surface layer of the p-type base layer 16 by ion implanting a p-type impurity such as aluminum (Al) so that the $p^+$-type region 18 is in contact with the $n^+$-type source region 17. Without limitation hereto, the $p^+$-type region 18 may be formed by oblique ion implantation from the trench portion after trench formation of the trench SBD 32.

Further, like the cross-sectional view of the structure depicted in FIG. 18Bb, the $p^+$-type region 18 may be formed to a depth position in the p-type base layer 16 and have a structure similar to the top view depicted in FIG. 18Aa. In this case as well, other than ion implantation from the front surface side, the p$^+$-type region 18 may be formed by oblique ion implantation from the trench portion after the trench formation of the trench SBD 32, thereby enabling formation to a depth position in the p-type base layer 16.

Figure 19:
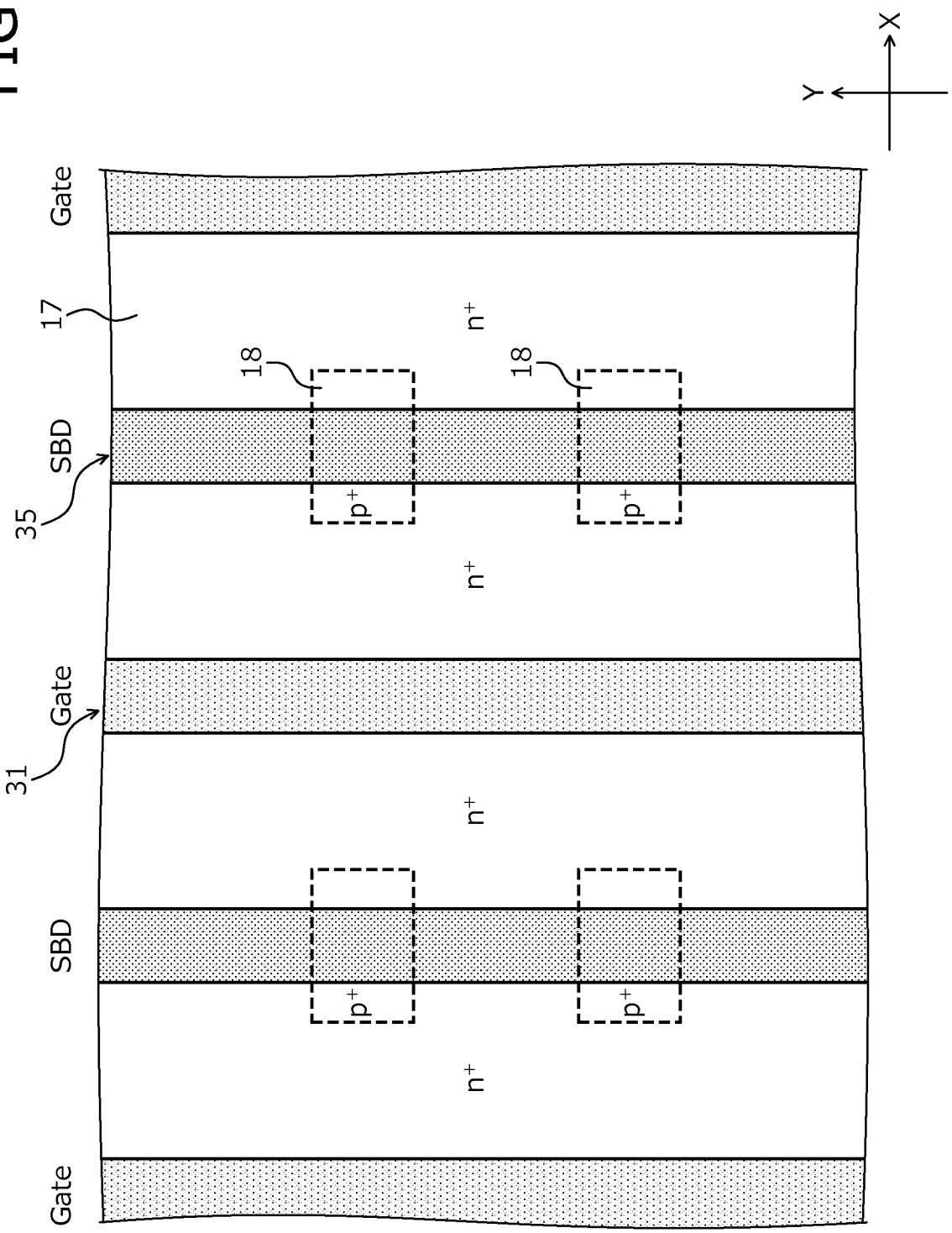
FIG. 19 is a top view of another structure of the silicon carbide semiconductor device according to the embodiment.
Figure 20:
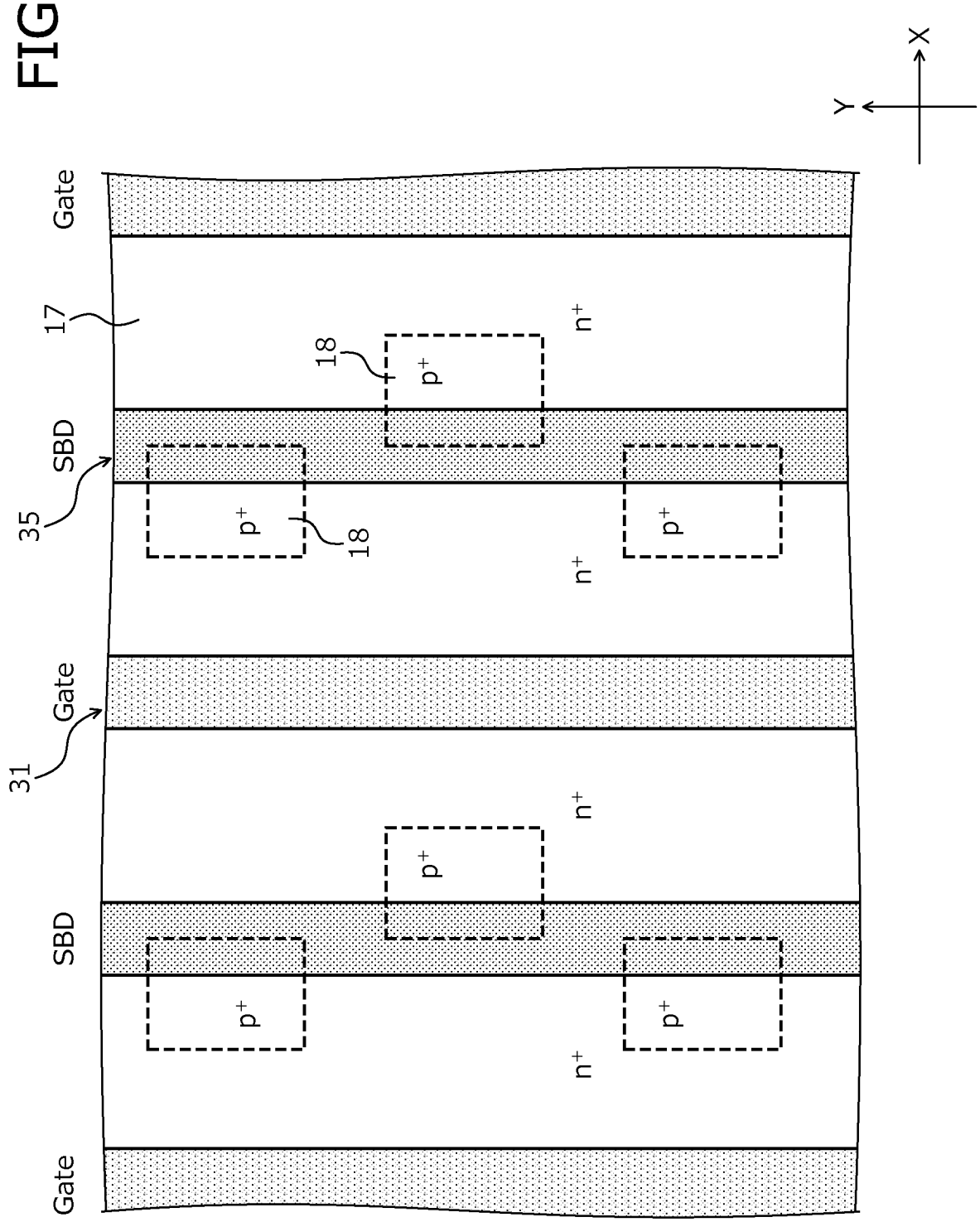
FIG. 20 is a top view of another structure of the silicon carbide semiconductor device according to the embodiment.

As depicted in the top view shown in FIG. 19, the p$^+$-type regions 18 may be formed along both side portions of the trench SBD 32 to be intermittent along the direction (the direction Y) along which the trench SBD 32 is provided. Further, as depicted in the top view shown in FIG. 20, the p$^+$-type regions 18 may be formed in a zig-zag pattern along the direction (the direction Y) along which the trench SBD 32 is provided, i.e., may be formed to alternate between one side portion and the other side portion of the trench SBD 32. Cross-sectional views corresponding to FIGS. 19 and 20, in particular, a cross-sectional structure of the p-type base layer 16 and the trench SBD 32, may be a combination of the various structures described above.

Figure 21:
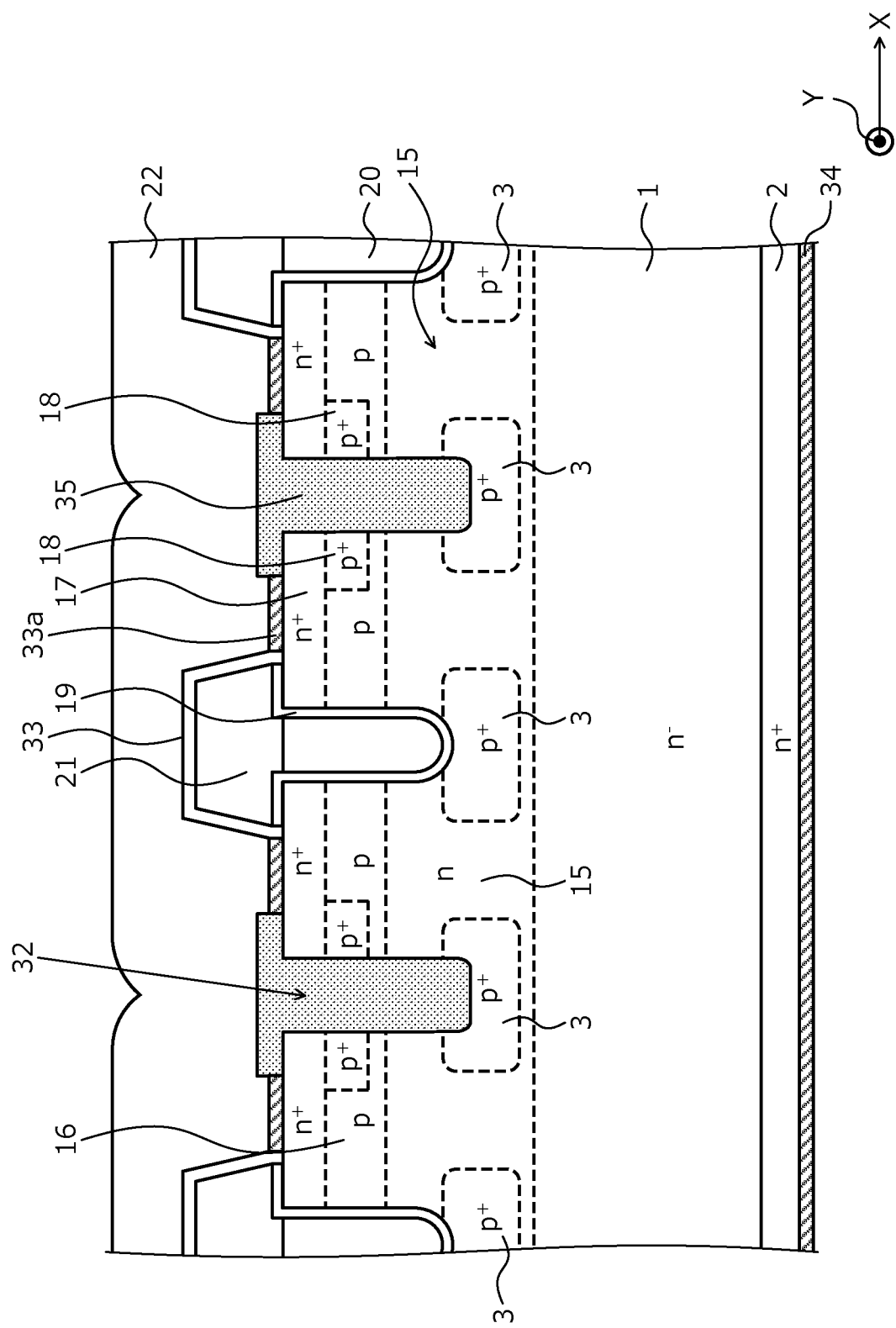
FIG. 21 is a cross-sectional view of another structure of the silicon carbide semiconductor device according to the embodiment.

As depicted in the cross-sectional view shown in FIG. 21, the p$^+$-type regions 18 may be provided in the p-type base layer 16, on both side portions of the trench SBD 32. In this case, other than forming the p$^+$-type regions 18 by ion implantation from the front surface side after formation of the p-type base layer 16, the p$^+$-type regions 18 may be formed by oblique ion implantation from the trench portion after the trench formation of the trench SBD 32.

Figure 22:
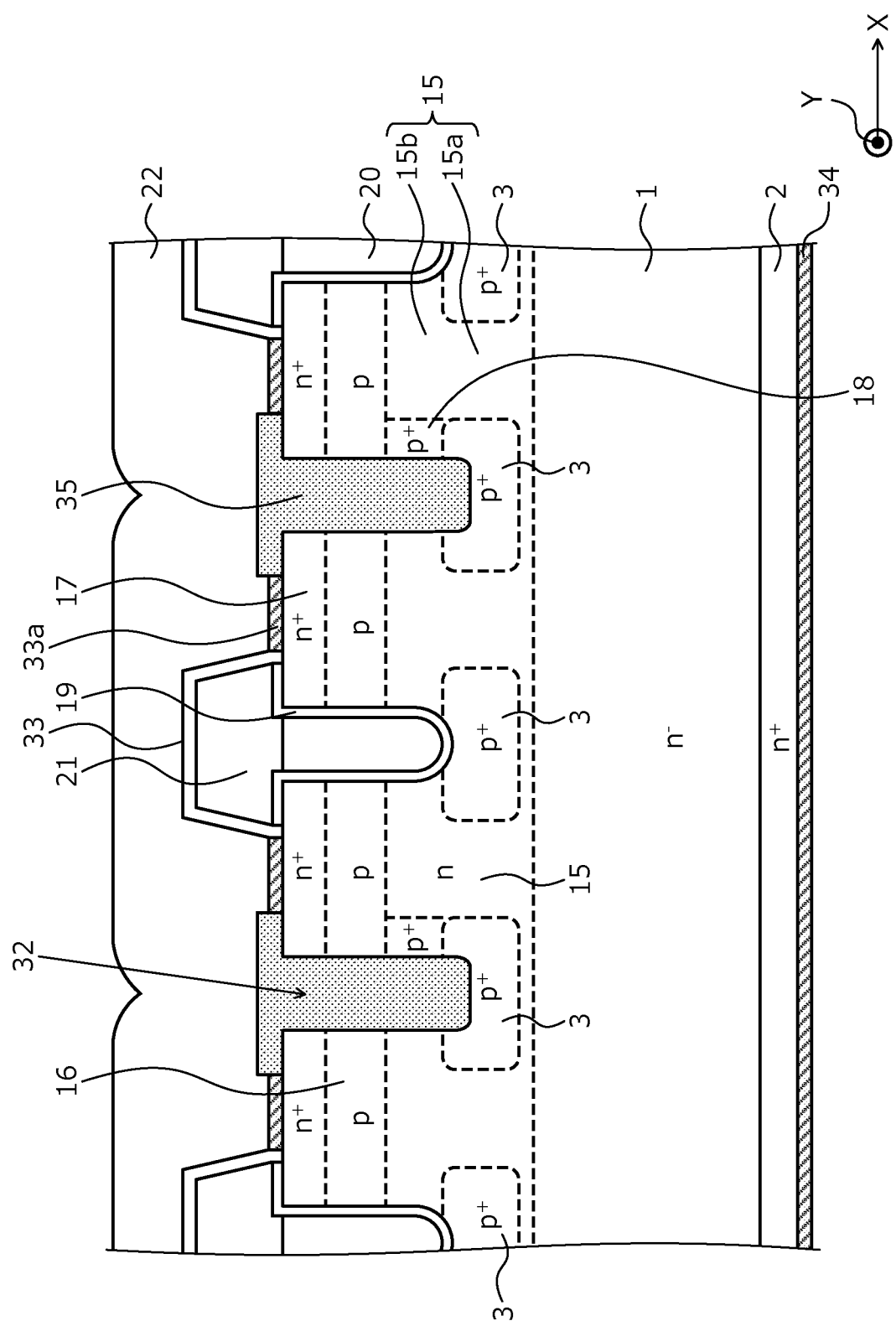
FIG. 22 is a cross-sectional view of another structure of the silicon carbide semiconductor device according to the embodiment.

As depicted by the cross-sectional view shown in FIG. 22, the p$^+$-type region 18 may be provided in a portion of the n-type region 15, near the bottom of the trench SBD 32. The p$^+$-type region 18, as depicted in a top view, for example, is provided continuously in one side portion of the trench SBD 32, along the direction (Y-axis direction) along which the trench SBD 32 is provided. The p$^+$-type region 18 may be formed by ion implantation from the front surface side after formation of the n-type region 15 (the upper n-type region 15b). As a result, the first p$^+$-type region 3 and the source electrode 22 may be connected by the p$^+$-type region 18, thereby enabling the contact resistance to be reduced as described above.

Figure 23:
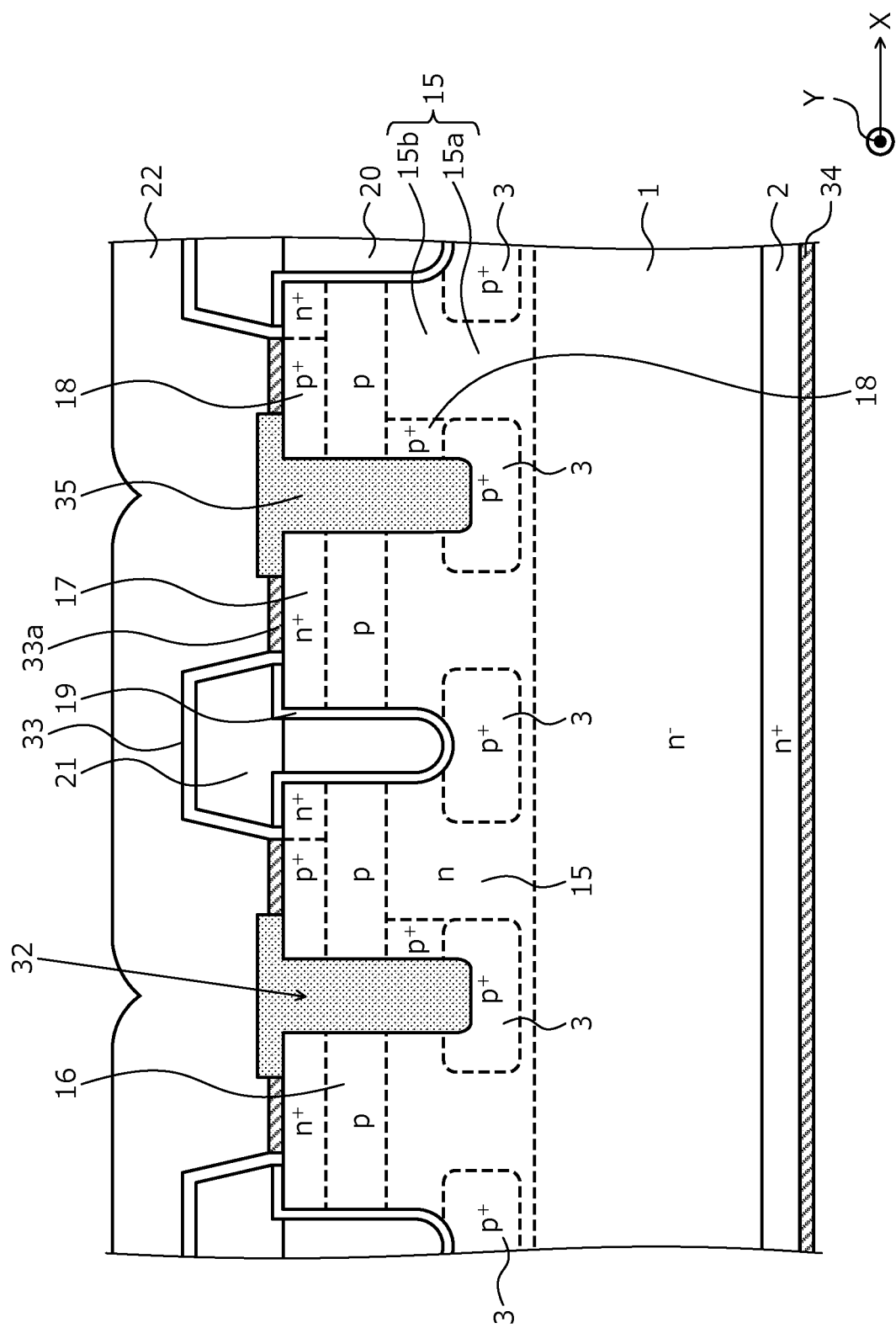
FIG. 23 is a cross-sectional view of another structure of the silicon carbide semiconductor device according to the embodiment.

Further, as depicted in the cross-sectional view shown in FIG. 23, the p$^+$-type region 18 may be provided in plural in a depth direction of the trench SBD 32. In the example depicted in FIG. 23, the p$^+$-type region 18 is formed in a portion of the n$^+$-type source region 17 on the front surface side (refer to FIG. 1A, etc.) and the p$^+$-type region 18 is further formed in a portion of the n-type region 15, near the bottom of the trench SBD 32 (refer to FIG. 22, etc.). For example, the p$^+$-type region 18 formed in a portion of the n$^+$-type source region 17 is provided on the front surface side along the direction (Y-axis direction) along which the trench SBD 32 is provided, so as to alternate between the side portions of the trench SBD 32 (refer to FIG. 1B, etc.), while the p$^+$-type region 18 formed in a portion of the n-type region 15, near the bottom of the trench SBD 32 is provided on one side of the trench SBD 32, continuously along the direction (Y-axis direction) along which the trench SBD 32 is provided. According to such a structure, a region of the p$^+$-type region 18 may be increased with respect to the first p$^+$-type region 3 and the source electrode 22, thereby enabling the contact resistance to be further reduced.

As described, according to the embodiment, the p$^+$-type region 18 having a high impurity concentration is provided between the source electrode 22 and the p-type base layer 16, whereby the channel p layer (the p-type base layer 16) and the source electrode 22 are connected via the p$^+$-type region 18 and the metal film (ohmic electrode) 33a. As a result, resistance between the source electrode 22 and the channel p layer may be reduced (contact resistance may be reduced), thereby enabling electric potential of the channel p layer (the p-type base layer 16) to be stabilized. Further, reduction of the contact resistance between the source electrode 22 and the channel p layer enables prevention of both threshold variation at the time of switching and decreases in avalanche resistance.

In the foregoing, the present invention may be variously modified within a range not departing from the spirit of the invention. For example, in the embodiments above, dimensions and impurity concentrations of regions, etc. may be variously set according to required specifications. Further, in the described embodiments, while a MOSFET is described as an example, without limitation hereto, wide application is further possible to various silicon carbide semiconductor devices that conduct and interrupt current under gate driving control based on a predetermined gate threshold. As a silicon carbide semiconductor device subject to gate driving control, an insulated gate bipolar transistor (IGBT) or the like may be given as an example. Further, in the embodiments described, while a case in which silicon carbide is used as a wide bandgap semiconductor material has been described as an example, a wide bandgap semiconductor material other than silicon carbide such as, for example, gallium nitride (GaN) is also applicable. Further, in the embodiments, while the first conductivity type is an n-type and the second conductivity type is a p-type, the present invention is similarly implemented when the first conductivity type is a p-type and the second conductivity type is an n-type.

As described above, the third semiconductor region of the second conductivity type and having a high impurity concentration is provided between the source electrode and the second semiconductor layer of second conductivity type, whereby between the second semiconductor layer of the second conductivity type and the source electrode, the third semiconductor region of the second conductivity type is connected ohmically. As a result, the resistance between the source electrode and the channel p layer may be reduced, enabling the electric potential of the third semiconductor region of the second conductivity type to be stabilized. Further, by reducing the contact resistance between the source electrode and the channel p layer, both threshold variation at the time of switching and decreases in avalanche resistance may be prevented.

The semiconductor device according to the embodiments of the invention achieves an effect in that the contact resistance between the channel p layer and the source electrode may be reduced.

As described, the semiconductor device according to the embodiments of the present invention is useful for power semiconductor devices used in power converting equipment, power supply devices used in various industrial machines, etc. and is particularly suitable for semiconductor devices having a trench gate structure.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device comprising:
   a semiconductor substrate of a first conductivity type;
   a first semiconductor layer that is of the first conductivity type, provided on a front surface of the semiconductor substrate, and has an impurity concentration lower than an impurity concentration of the semiconductor substrate;

a first semiconductor region that is of a second conductivity type and selectively provided in the first semiconductor layer;

a second semiconductor region that is of the second conductivity type and selectively provided at a first surface of the first semiconductor layer, the first surface being opposite a second surface of the first semiconductor layer, the second surface facing toward the semiconductor substrate;

a second semiconductor layer that is of the second conductivity type and provided on the first surface of the first semiconductor layer;

third semiconductor regions that are of the first conductivity type, selectively provided in the second semiconductor layer of the second conductivity type, and have an impurity concentration higher than the impurity concentration of the semiconductor substrate;

a first trench and a second trench that penetrate the third semiconductor regions of the first conductivity type and the second semiconductor layer of the second conductivity type, reach the first semiconductor layer, and have respective bottoms that are in contact with the first semiconductor regions, respectively;

a gate electrode that is provided in the first trench, via a gate insulating film;

a Schottky electrode that is provided in the second trench and that is connected to a source electrode; and a third semiconductor region that is of the second conductivity type, provided in a side portion of the second trench, and has an impurity concentration higher than the impurity concentration of the second semiconductor layer that is of the second conductivity type.

2. The semiconductor device according to claim 1, wherein
the third semiconductor region of the second conductivity type is provided between the source electrode and the second semiconductor layer of the second conductivity type.

3. The semiconductor device according to claim 1, wherein
the third semiconductor region of the second conductivity type is provided in a first side portion and a second side portion sandwiching the second trench, the third semiconductor region being provided to be continuous, or to alternate, or be intermittent along a formation direction of the second trench.

4. The semiconductor device according to claim 1, wherein
the third semiconductor region of the second conductivity type is in contact with one of the third semiconductor regions of the first conductivity type.

5. The semiconductor device according to claim 1, wherein
the third semiconductor region of the second conductivity type is provided in the second semiconductor layer of the second conductivity type.

6. The semiconductor device according to claim 1, wherein
the third semiconductor region of the second conductivity type is provided in the second semiconductor layer of the second conductivity type and one of the third semiconductor regions of the first conductivity type.

7. The semiconductor device according to claim 1, wherein
the third semiconductor region of the second conductivity type is provided at a position in a first side portion and a position in a second side portion sandwiching the second trench, the third semiconductor region being provided to be continuous, or to alternate, or to be intermittent long a formation direction of the second trench, and to connect the first semiconductor region and the second semiconductor layer of the second conductivity type.

* * * * *